US011361696B2

(12) United States Patent
Feng et al.

(10) Patent No.: US 11,361,696 B2
(45) Date of Patent: Jun. 14, 2022

(54) SHIFT REGISTER AND DRIVING METHOD THEREFOR, GATE DRIVER CIRCUIT, AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/052,135

(22) PCT Filed: Aug. 8, 2019

(86) PCT No.: PCT/CN2019/099750
§ 371 (c)(1),
(2) Date: Oct. 30, 2020

(87) PCT Pub. No.: WO2021/022540
PCT Pub. Date: Feb. 11, 2021

(65) Prior Publication Data
US 2021/0166603 A1    Jun. 3, 2021

(51) Int. Cl.
G09G 3/20      (2006.01)
G11C 19/28     (2006.01)
(52) U.S. Cl.
CPC ............... G09G 3/20 (2013.01); G11C 19/28 (2013.01); G09G 2310/0267 (2013.01); G09G 2310/0286 (2013.01); G09G 2310/08 (2013.01)

(58) Field of Classification Search
CPC ............. G09G 3/20; G09G 2310/0267; G09G 2310/0286; G09G 2310/08
See application file for complete search history.

(56) References Cited

U.S. PATENT DOCUMENTS

2008/0055225 A1   3/2008  Pak et al.
2013/0222357 A1   8/2013  Tseng et al.
(Continued)

FOREIGN PATENT DOCUMENTS

CN    101136185 A    3/2008
CN    101312019 A    11/2008
(Continued)

OTHER PUBLICATIONS

China National Intellectual Property Administration. Chinese Patent Application No. 201980001302.1. Applicant: BOE Technology Group Co., Ltd. Notification of the First Office Action dated Mar. 30, 2022. Chinese Language. 11 pages.
(Continued)

Primary Examiner — Sejoon Ahn
(74) Attorney, Agent, or Firm — Procopio, Cory, Hargreaves & Savitch LLP

(57) ABSTRACT

A shift register includes an output sub-circuit, a cascade sub-circuit and at least one additional output sub-circuit. The output sub-circuit is configured to transmit a first clock signal received at the first clock signal terminal to the output signal terminal under control of a potential at the pull-up node, so as to scan a gate line coupled to the output signal terminal. The cascade sub-circuit is configured to transmit a second clock signal received at the second clock signal terminal to the cascade node under the control of the potential at the pull-up node. Each additional output sub-circuit is configured to transmit a clock signal received at a corresponding clock signal terminal to a corresponding additional output signal terminal under control of a potential
(Continued)

at the cascade node, so as to scan a gate line coupled to the corresponding additional output signal terminal.

17 Claims, 7 Drawing Sheets

(56) References Cited

U.S. PATENT DOCUMENTS

| | | | |
|---|---|---|---|
| 2014/0159997 | A1 | 6/2014 | Chen et al. |
| 2015/0002504 | A1 | 1/2015 | Jo |
| 2016/0300623 | A1* | 10/2016 | Yang .................. G11C 19/28 |
| 2016/0358666 | A1 | 12/2016 | Pang |
| 2019/0108808 | A1* | 4/2019 | Lv ...................... G09G 3/3677 |
| 2019/0108809 | A1 | 4/2019 | Zheng et al. |
| 2019/0114952 | A1 | 4/2019 | Li et al. |
| 2019/0325834 | A1 | 10/2019 | Feng et al. |
| 2021/0201810 | A1 | 7/2021 | Feng et al. |
| 2021/0335312 | A1* | 10/2021 | Tomitani ............. G09G 3/3413 |
| 2021/0335314 | A1* | 10/2021 | Yuan ................... G09G 3/3688 |
| 2021/0375211 | A1 | 12/2021 | Feng et al. |

FOREIGN PATENT DOCUMENTS

| | | |
|---|---|---|
| CN | 102982760 A | 3/2013 |
| CN | 103578433 A | 2/2014 |
| CN | 104252851 A | 12/2014 |
| CN | 104835476 A | 8/2015 |
| CN | 107507599 A | 12/2017 |
| CN | 107633799 A | 1/2018 |
| CN | 107689221 A | 2/2018 |
| CN | 108564914 A | 9/2018 |
| CN | 109935209 A | 6/2019 |
| CN | 109935212 A | 6/2019 |
| KR | 20060034059 A | 4/2006 |
| KR | 20150002030 A | 1/2015 |

OTHER PUBLICATIONS

China National Intellectual Property Administration. Chinese Patent Application No. 201980001302.1. Applicant: BOE Technology Group Co., Ltd. Notification of the First Office Action dated Mar. 30, 2022. English Language Translation. 16 pages.

* cited by examiner

SHIFT REGISTER AND DRIVING METHOD THEREFOR, GATE DRIVER CIRCUIT, AND DISPLAY DEVICE

CROSS-REFERENCE TO RELATED APPLICATION

This application is a national phase entry under 35 USC 371 of International Patent Application No. PCT/CN2019/099750 filed on Aug. 8, 2019, which is incorporated herein by reference in its entirety.

TECHNICAL FIELD

The present disclosure relates to the field of display technologies, and in particular, to a shift register and a driving method therefor, a gate driver circuit, and a display device.

BACKGROUND

In a field of display technologies, in order to improve a screen-to-body ratio of a display device, gate driver on array (GOA) technology is generally applied to a gate driver circuit in the display device. The GOA technology is to integrate a plurality of shift registers that are cascaded onto an array substrate to form the gate driver circuit. The gate driver circuit manufactured by using the GOA technology has advantages of low cost and being conductive to achieving a narrow bezel of a display screen.

SUMMARY

In an aspect, a shift register is provided. The shift register includes an output sub-circuit, a cascade sub-circuit and at least one additional output sub-circuit. The output sub-circuit is coupled to a first clock signal terminal, a pull-up node, and an output signal terminal, and is configured to transmit a first clock signal received at the first clock signal terminal to the output signal terminal under control of a potential at the pull-up node, so as to scan a gate line coupled to the output signal terminal. The cascade sub-circuit is coupled to a second clock signal terminal, the pull-up node, and a cascade node, and is configured to transmit a second clock signal received at the second clock signal terminal to the cascade node under the control of the potential at the pull-up node. Each additional output sub-circuit is coupled to a corresponding clock signal terminal, the cascade node, and a corresponding additional output signal terminal, and is configured to transmit a clock signal received at the corresponding dock signal terminal to the corresponding additional output signal terminal under control of a potential at the cascade node, so as to scan a gate line coupled to the corresponding additional output signal terminal.

In some embodiments, the output sub-circuit includes a first transistor. A control electrode of the first transistor is coupled to the pull-up node, a first electrode of the first transistor is coupled to the first clock signal terminal, and a second electrode of the first transistor is coupled to the output signal terminal.

In some embodiments, the cascade sub-circuit includes a second transistor and a capacitor. A control electrode of the second transistor is coupled to the pull-up node, a first electrode of the second transistor is coupled to the second clock signal terminal, and a second electrode of the second transistor is coupled to the cascade node. One terminal of the capacitor is coupled to the pull-up node, and the other terminal of the capacitor is coupled to the cascade node.

In some embodiments, each additional output sub-circuit includes at least one additional transistor. A control electrode of one of the at least one additional transistor is coupled to the cascade node, a first electrode of the additional transistor is coupled to the corresponding clock signal terminal, and a second electrode of the additional transistor is coupled to the corresponding additional output signal terminal.

In some embodiments, the shift register further includes: a pull-up control sub-circuit, a pull-down control sub-circuit, a cascade pull-down sub-circuit, an output pull-down sub-circuit and at least one additional output pull-down sub-circuit. The pull-up control sub-circuit is coupled to an input signal terminal, a first voltage signal terminal, the pull-up node, a pull-down node, and a second voltage signal terminal, and is configured to transmit a first voltage signal received at the first voltage signal terminal to the pull-up node in response to an input signal received at the input signal terminal, and transmit a second voltage signal received at the second voltage signal terminal to the pull-up node under control of a potential at the pull-down node. The pull-down control sub-circuit is coupled to a third voltage signal terminal, the pull-down node, the pull-up node, and the second voltage signal terminal, and is configured to transmit a third voltage signal received at the third voltage signal terminal to the pull-down node in response to the third voltage signal, and transmit the second voltage signal to the pull-down node under the control of the potential at the pull-up node. The cascade pull-down sub-circuit is coupled to the cascade node, the pull-down node, and the second voltage signal terminal, and is configured to transmit the second voltage signal to the cascade node under the control of the potential at the pull-down node. The output pull-down sub-circuit is coupled to the output signal terminal, the pull-down node, and a fourth voltage signal terminal, and is configured to transmit a fourth voltage signal received at the fourth voltage signal terminal to the output signal terminal under the control of the potential at the pull-down node. Each additional output pull-down sub-circuits is coupled to the pull-down node, the fourth voltage signal terminal, and a corresponding additional output signal terminal, and is configured to transmit the fourth voltage signal to the corresponding additional output signal terminal under the control of the potential at the pull-down node.

In some embodiments, the pull-up control sub-circuit includes a third transistor and a fourth transistor. A control electrode of the third transistor is coupled to the input signal terminal, a first electrode of the third transistor is coupled to the first voltage signal terminal, and a second electrode of the third transistor is coupled to the pull-up node. A control electrode of the fourth transistor is coupled to the pull-down node, a first electrode of the fourth transistor is coupled to the second voltage signal terminal, and a second electrode of the fourth transistor is coupled to the pull-up node. The pull-down control sub-circuit includes a fifth transistor and a sixth transistor. A control electrode and a first electrode of the fifth transistor are coupled to the third voltage signal terminal, and a second electrode of the fifth transistor is coupled to the pull-down node and a second electrode of the sixth transistor. A control electrode of the sixth transistor is coupled to the pull-up node, and a first electrode of the sixth transistor is coupled to the second voltage signal terminal. The cascade pull-down sub-circuit includes an eighth transistor. A control electrode of the eighth transistor is coupled to the pull-down node, a first electrode of the eighth transistor is coupled to the second voltage signal terminal, and a second electrode of the eighth transistor is coupled to the cascade node. The output pull-down sub-circuit includes a ninth transistor. A control electrode of the ninth transistor is coupled to the pull-down node, a first electrode of the ninth transistor is coupled to the fourth voltage signal terminal, and a second electrode of the ninth transistor is coupled to the output signal terminal. Each additional output pull-down sub-circuit includes at least one additional pull-down transistor. A control electrode of one of the at least one additional pull-down transistor is coupled to the pull-down node, a first electrode of the additional pull-down transistor is coupled to the fourth voltage signal terminal, and a second electrode of the additional pull-down transistor is coupled to a corresponding additional output signal terminal.

In some embodiments, the shift register further includes a first reset sub-circuit and a second reset sub-circuit. The first reset sub-circuit is coupled to a first reset signal terminal, the pull-up node, and the second voltage terminal, and is configured to transmit the second voltage signal to the pull-up node in response to a first reset signal received at the first reset signal terminal. The second reset sub-circuit is coupled to a second reset signal terminal, the second voltage signal terminal, and the cascade node, and is configured to transmit the second voltage signal to the cascade node in response to a second reset signal received at the second reset signal terminal.

In some embodiments, the first reset sub-circuit includes a seventh transistor. A control electrode of the seventh transistor is coupled to the first reset signal terminal, a first electrode of the seventh transistor is coupled to the second voltage signal terminal, and a second electrode of the seventh transistor is coupled to the pull-up node. The second reset sub-circuit includes a thirteenth transistor A control electrode of the thirteenth transistor is coupled to the second reset signal terminal, a first electrode of the thirteenth transistor is coupled to the second voltage signal terminal, and a second electrode of the thirteenth transistor is coupled to the cascade node.

In some embodiments, the shift register further includes a third reset sub-circuit. The third reset sub-circuit is coupled to a third reset signal terminal, the pull-up node, and the second voltage signal terminal, and is configured to transmit the second voltage signal to the pull-up node in response to a third reset signal received at the third reset signal terminal.

In some embodiments, the third reset sub-circuit includes a tenth transistor. A control electrode of the tenth transistor is coupled to the third reset signal terminal, a first electrode of the tenth transistor is coupled to the second voltage signal terminal, and a second electrode of the tenth transistor is coupled to the pull-up node.

In some embodiments, the shift register includes one or two additional output sub-circuits.

In some embodiments, the at least one additional output sub-circuit includes a first additional output sub-circuit. The first additional output sub-circuit is coupled to a third clock signal terminal, the cascade node, and a first additional output signal terminal, and is configured to transmit a third clock signal received at the third clock signal terminal to the first additional output signal terminal under the control of the potential at the cascade node.

In some embodiments, the output sub-circuit includes a first transistor. A control electrode of the first transistor is coupled to the pull-up node, a first electrode of the first transistor is coupled to the first clock signal terminal, and a second electrode of the first transistor is coupled to the output signal terminal. The cascade sub-circuit includes a second transistor and a capacitor. A control electrode of the second transistor is coupled to the pull-up node, a first electrode of the second transistor is coupled to the second clock signal terminal, and a second electrode of the second transistor is coupled to the cascade node One terminal of the capacitor is coupled to the pull-up node, and another terminal of the capacitor is coupled to the cascade node. The capacitor is configured to store a voltage at the pull-up node or discharge the pull-up node. The first additional output sub-circuit includes an eleventh transistor. A control electrode of the eleventh transistor is coupled to the cascade node, a first electrode of the eleventh transistor is coupled to the third clock signal terminal, and a second electrode of the eleventh transistor is coupled to the first additional output signal terminal. The shift register further includes: a pull-up control sub-circuit, a pull-down control sub-circuit, a cascade pull-down sub-circuit, an output pull-down sub-circuit, and a first additional output pull-down sub-circuit. The pull-up control sub-circuit includes a third transistor and a fourth transistor. A control electrode of the third transistor is coupled to an input signal terminal, a first electrode of the third transistor is coupled to a first voltage signal terminal, and a second electrode of the third transistor is coupled to the pull-up node. A control electrode of the fourth transistor is coupled to a pull-down node, a first electrode of the fourth transistor is coupled to a second voltage signal terminal, and a second electrode of the fourth transistor is coupled to the pull-up node. The pull-down control sub-circuit includes a fifth transistor and a sixth transistor. A control electrode and a first electrode of the fifth transistor are coupled to a third voltage signal terminal, and a second electrode of the fifth transistor is coupled to the pull-down node and a second electrode of the sixth transistor, A control electrode of the sixth transistor is coupled to the pull-up node, and a first electrode of the sixth transistor is coupled to the second voltage signal terminal. The cascade pull-down sub-circuit includes an eighth transistor. A control electrode of the eighth transistor is coupled to the pull-down node, a first electrode of the eighth transistor is coupled to the second voltage signal terminal, and a second electrode of the eighth transistor is coupled to the cascade node. The output pull-down sub-circuit includes a ninth transistor. A control electrode of the ninth transistor is coupled to the pull-down node, a first electrode of the ninth transistor is coupled to a fourth voltage signal terminal, and a second electrode of the ninth transistor is coupled to the output signal terminal. The first additional output pull-down sub-circuit includes a twelfth transistor. A control electrode of the twelfth transistor is coupled to the pull-down node, a first electrode of the twelfth transistor is coupled to the fourth voltage signal terminal, and a second electrode of the twelfth transistor is coupled to the first additional output signal terminal.

In some embodiments, the shift register further includes a first reset sub-circuit, a second reset sub-circuit, and a third reset sub-circuit. The first reset sub-circuit includes a seventh transistor. A control electrode of the seventh transistor is coupled to a first reset signal terminal, a first electrode of the seventh transistor is coupled to the second voltage signal terminal, and a second electrode of the seventh transistor is coupled to the pull-up node. The second reset sub-circuit includes a thirteenth transistor. A control electrode of the thirteenth transistor is coupled to a second reset signal terminal, a first electrode of the thirteenth transistor is coupled to the second voltage signal terminal, and a second electrode of the thirteenth transistor is coupled to the cascade node. The third reset sub-circuit includes a tenth transistor. A control electrode of the tenth transistor is coupled to a third reset signal terminal, a first electrode of the tenth transistor is coupled to the second voltage signal terminal, and a second electrode of the tenth transistor is coupled to the pull-up node.

In some embodiments, the at least one additional output sub-circuit further includes a second additional output sub-circuit. The second additional output sub-circuit includes a fourteenth transistor, A control electrode of the fourteenth transistor is coupled to the cascade node, a first electrode of the fourteenth transistor is coupled to a fourth clock signal terminal, and a second electrode of the fourteenth transistor is coupled to a second additional output signal terminal. The shift register further includes a second additional output pull-down sub-circuit. The second additional output pull-down sub-circuit includes a fifteenth transistor. A control electrode of the fifteenth transistor is coupled to the pull-down node, a first electrode of the fifteenth transistor is coupled to the fourth voltage signal terminal, and a second electrode of the fifteenth transistor is coupled to the second additional output signal terminal.

In another aspect, a gate driver circuit is provided. The gate driver circuit includes a plurality of shift registers that are cascaded, and each of the plurality of shift registers is the shift register according to the above embodiments.

In some embodiments, each shift register has an input signal terminal, a first reset signal terminal, and a cascade signal output terminal coupled to the cascade node. Input signal terminals of first two stage shift registers are both coupled to a frame start signal terminal. Except first two stage shift registers, an input signal terminal of an Nth-stage shift register is coupled to a cascade signal output terminal of a (N−2)th-stage shift register. Except last three stage shift registers, a first reset signal terminal of the Nth-stage shift register is coupled to a cascade signal output terminal of a (N+3)th-stage shift register.

In yet another aspect, a display device is provided. The display device includes the gate driver circuit according to the above embodiments and a plurality of gate lines. The plurality of gate lines are divided into a plurality of gate line groups, and each gate line group including at least two gate lines arranged in sequence. The plurality of shift registers included in the gate driver circuit each correspond to a respective one of the plurality of gate line groups, and the output signal terminal and at least one additional output signal terminal in each shift register are coupled to at least two gate lines in a corresponding gate line group.

In yet another aspect, a driving method for a shift register is provided. The driving method for the shift register is configured to drive the shift register according to the above embodiments. The driving method for the shift register includes: in a first period, receiving, by the pull-up control sub-circuit, an input signal, transmitting, by the pull-up control sub-circuit, a first voltage signal to the pull-up node, and storing, by a cascade sub-circuit, a voltage at the pull-up node; in a second period, discharging, by the cascade sub-circuit, the pull-up node. An output sub-circuit is turned on under control of a potential at the pull-up node, to transmit a first clock signal to the output signal terminal, so as to scan a gate line coupled to the output signal terminal; and the cascade sub-circuit is turned on under control of a potential at the pull-up node to transmit a second clock signal to the cascade node. Each additional output sub-circuit is turned on under control of a potential at the cascade node to transmit a clock signal received at a corresponding clock signal terminal to a corresponding additional output signal terminal, so as to scan a gate line coupled to the corresponding additional output signal terminal.

In some embodiments, in a case where the shift register further includes a first reset sub-circuit, the driving method further includes: in a third period, receiving, by the first reset sub-circuit, a first reset signal, and transmitting, by the first reset sub-circuit, a second voltage signal to the pull-up node. The output sub-circuit and the cascade sub-circuit are turned off under the control of the potential at the pull-up node. Each additional output sub-circuit is turned off under the control of the potential at the cascade node. The output pull-down sub-circuit is turned on under control of a potential at the pull-down node to transmit a fourth voltage signal to the output signal terminal, so as to reduce noise of a signal at the output signal terminal; the cascade pull-down sub-circuit is turned on under control of the potential at the pull-down node to transmit the second voltage signal to the cascade node correspondingly, so as to reduce noise of a signal at the cascade node; and each additional output pull-down sub-circuit is turned on under control of the potential at the pull-down node to transmit the fourth voltage signal to a corresponding additional output signal terminal, so as to reduce noise of a signal at the corresponding additional output signal terminal.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings.

DETAILED DESCRIPTION

Technical solutions in some embodiments of the present disclosure will be described below clearly and completely with reference to the accompanying drawings in the embodiments of the present disclosure. Obviously, the described embodiments are merely some but not all embodiments of the present disclosure. All other embodiments obtained on a basis of the embodiments of the present disclosure by a person of ordinary skill in the art shall be included in the protection scope of the present disclosure.

In GOA technology, a gate driver circuit includes a plurality of shift registers that are cascaded. An output signal terminal of each shift register is coupled to a gate line, and is configured to scan the gate line to turn on a row of sub-pixels coupled to the gate line. Since a structure of each shift register is complicated, and each shift register can only scan one gate line, the gate driver circuit including the plurality of shift registers occupies a large area in a display device. Therefore, a demand for a narrow bezel of a high-resolution display device may not be met.

Figure 1:
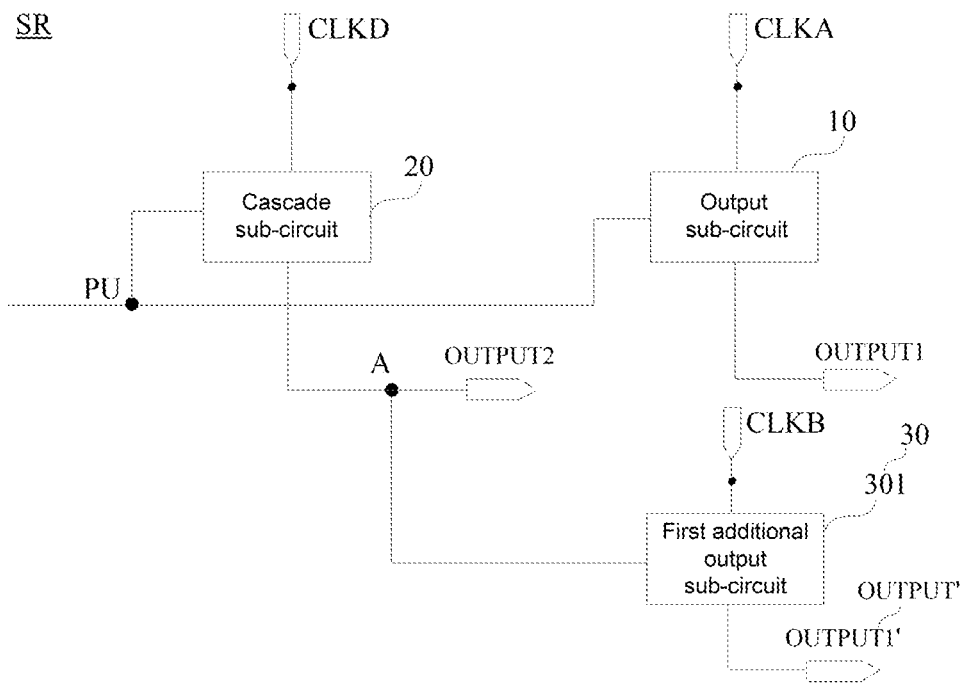
FIG. 1 is a schematic circuit diagram of a shift register, in accordance with some embodiments.
Figure 2A:
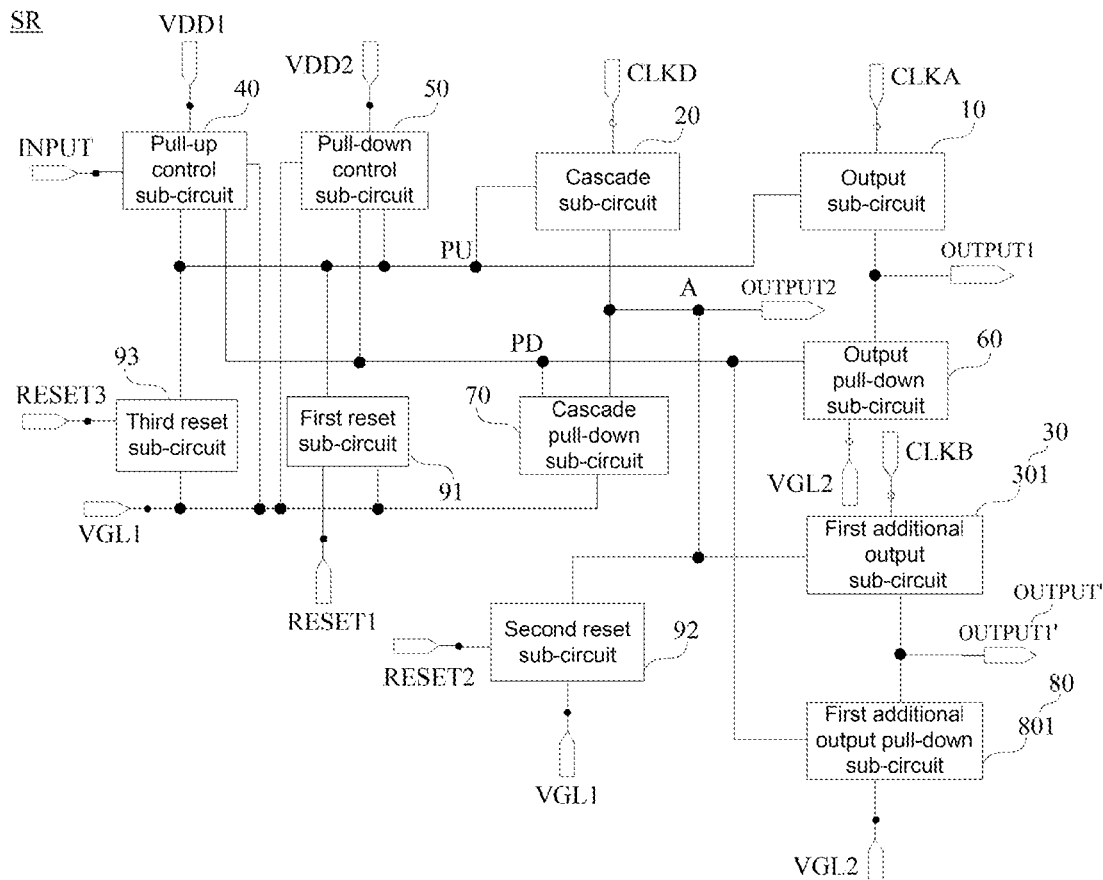
FIG. 2A is a schematic circuit diagram of another shift register, in accordance with some embodiments.

As shown in FIGS. 1, 2A and 28, some embodiments of the present disclosure provide a shift register SR. The shift register SR includes an output sub-circuit 10, a cascade sub-circuit 20, and at least one additional output sub-circuit 30.

The output sub-circuit 10 is coupled to a first clock signal terminal CLKA, a pull-up node PU, and an output signal terminal OUTPUT1. The first clock signal terminal CLKA is configured to receive a first clock signal Clka and provide the first clock signal Clka to the output sub-circuit 10. The output sub-circuit 10 is configured to transmit the first clock signal Clka to the output signal terminal OUTPUT1 under control of a potential at the pull-up node PU to scan a gate line coupled to the output signal terminal OUTPUT1.

The cascade sub-circuit 20 is coupled to a second clock signal terminal CLKD, the pull-up node PU, and a cascade node A The second clock signal terminal CLKD is configured to receive a second clock signal Clkd and provide the second clock signal Clkd to the cascade sub-circuit 20. The cascade sub-circuit 20 is configured to transmit the second clock signal Clkd to the cascade node A under the control of the potential at the pull-up node PU.

In some embodiments, in a case where a plurality of shift registers SR are cascaded, the cascade sub-circuit 20 is coupled to a cascade signal output terminal OUTPUT2, and the cascade sub-circuit 20 transmits, through the cascade signal output terminal OUTPUT2, a cascade signal Output2 to a shift register SR cascaded with the shift register SR including the cascade sub-circuit 20. The cascade signal Output2 is used as an input signal of the shift register SR cascaded with the shift register SR including the cascade sub-circuit 20. Herein, the cascade node A is any point on a connection line between the cascade sub-circuit 20 and the cascade signal output terminal OUTPUT2.

Each additional output sub-circuit 30 of the at least one additional output sub-circuit 30 is coupled to a corresponding clock signal terminal, the cascade node A, and a corresponding additional output signal terminal OUTPUT'. Each additional output sub-circuit 30 corresponds to a clock signal terminal which is configured to receive a corresponding clock signal, and provide the clock signal to the additional output sub-circuit 30. Each additional output sub-circuit 30 is configured to transmit a corresponding clock signal to a corresponding additional output signal terminal OUTPUT' under control of a potential at the cascade node A, so as to scan a gate line coupled to the corresponding additional output signal terminal OUTPUT'.

On this basis, the shift register SR provided by same embodiments of the present disclosure has one output signal terminal OUTPUT1 and at least one additional output signal terminal OUTPUT'. The output signal terminal OUTPUT1 and the at least one additional output signal terminal OUTPUT' are coupled to at least two gate lines, respectively. Moreover, under control of the potential at the pull-up node PU and the potential at the cascade node A, the output signal terminal OUTPUT1 and the at least one additional output signal terminal OUTPUT' can sequentially provide corresponding scanning signals to respective gate lines coupled thereto, thereby turning on the at least two gate lines row by row to drive at least two rows of sub-pixels coupled to the at least two gate lines to display an image.

It can be seen that, in the embodiments of the present disclosure, scanning of at least two gate lines may be achieved by a shift register SR. Compared with the related art in which one shift register in the gate driver circuit can scan only one gate line, in a case where a same number of gate lines need to be scanned, the number of the shift registers SR in the gate driver circuit may be reduced in the embodiments of the present disclosure, thereby saving space occupied by the gate driver circuit, and achieving a narrow bezel design of the display device.

Figure 3:
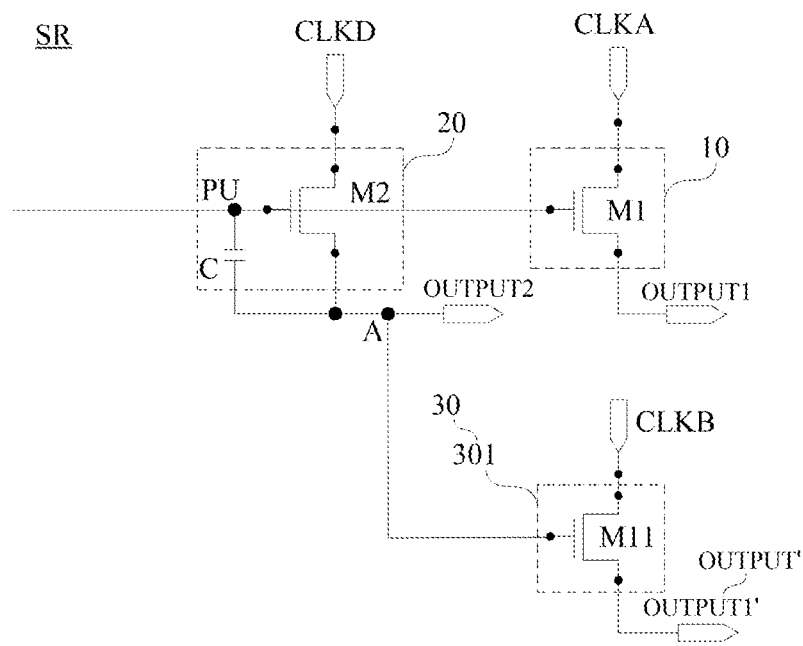
FIG. 3 is a diagram showing a circuit structure of a shift register, in accordance with some embodiments.
Figure 4A:
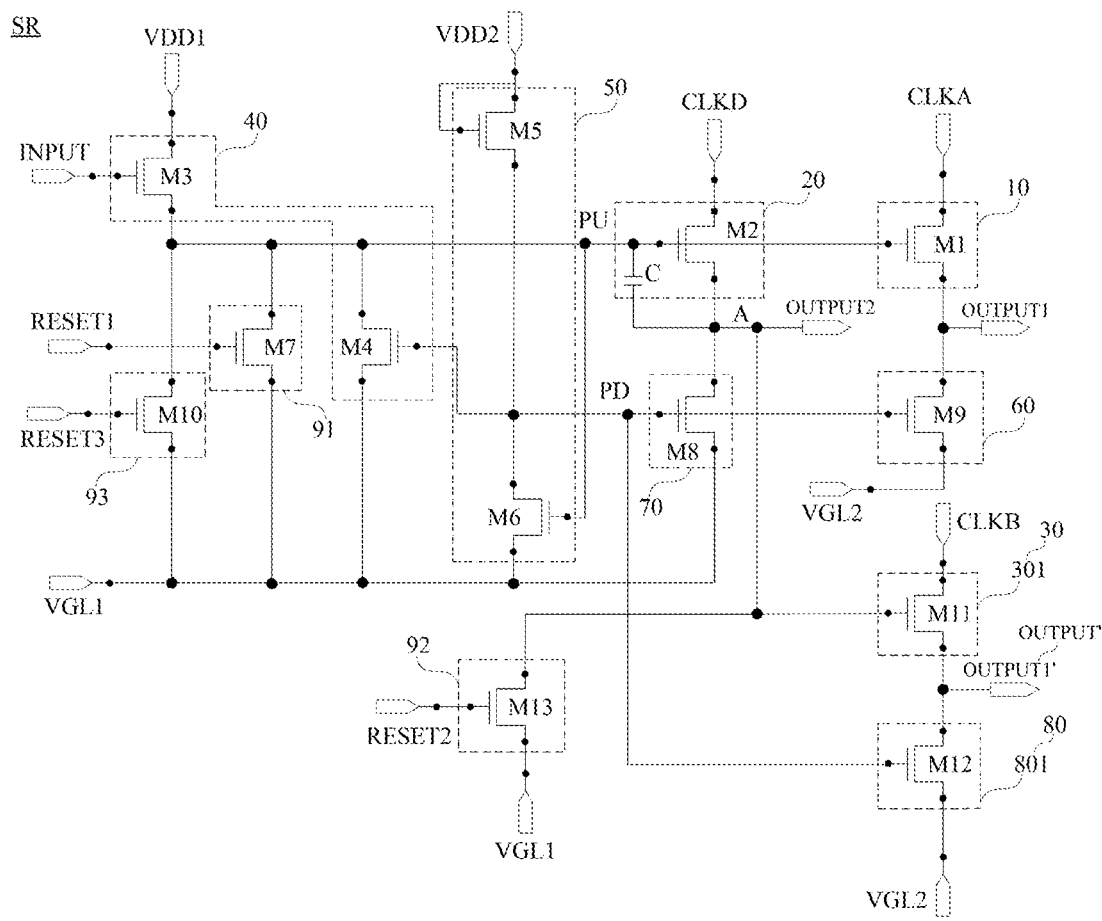
FIG. 4A is a diagram showing a circuit structure of another shift register, in accordance with some embodiments.
Figure 4B:
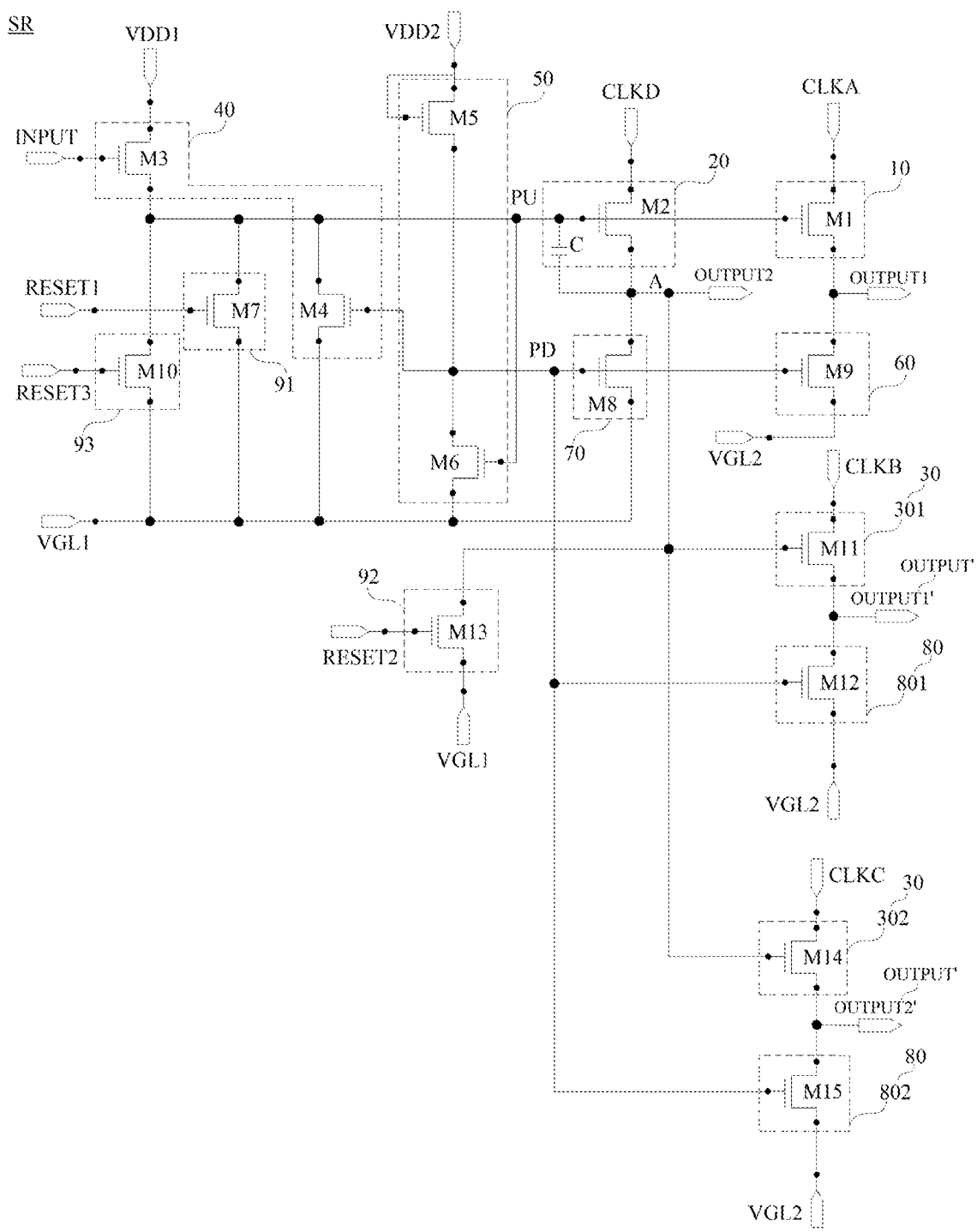
FIG. 4B is a diagram showing a circuit structure of yet another shift register, in accordance with some embodiments.

For example, as shown in FIGS. 3, 4A and 4B, the output sub-circuit 10 includes a first transistor M1. A control electrode of the first transistor M1 is coupled to the pull-up node PU, a first electrode of the first transistor M1 is coupled to the first clock signal terminal CLKA, and a second electrode of the first transistor M1 is coupled to the output signal terminal OUTPUT1. The first transistor M1 is configured to be turned on under the control of the potential at the pull-up node PU to transmit the first clock signal Clka to the output signal terminal OUTPUT1.

For example, as shown in FIGS. 3, 4A and 4S, the cascade sub-circuit 20 includes a second transistor M2 and a capacitor C.

A control electrode of the second transistor M2 is coupled to the pull-up node PU, a first electrode of the second transistor M2 is coupled to the second clock signal terminal CLKD, and a second electrode of the second transistor M2 is coupled to the cascade node A. The second transistor M2 is configured to be turned on under the control of the potential at the pull-up node PU to transmit the second clock signal Clkd to the cascade node A.

One terminal of the capacitor C is coupled to the pull-up node PU, and the other terminal of the capacitor C is coupled to the cascade node A. The capacitor C is configured to store a voltage at the pull-up node PU during an input phase in a driving process of the shift register SR, and output the voltage to the pull-up node PU during an output phase in the driving process of the shift register SR.

It will be noted that, the capacitor C may be a capacitor formed by using a parasitic capacitance between wires of the circuit itself, or may be an additional capacitor separately provided in the circuit, which is not specifically limited in the embodiments of the present disclosure.

For example, as shown in FIGS. 3, 4A and 48, each additional output sub-circuit 30 of the at least one additional output sub-circuit 30 includes at least one additional transistor (e.g., an eleventh transistor M11 in FIG. 3 or 4A, or the eleventh transistor M11 and a fourteenth transistor M14 in FIG. 48). A control electrode of one of the at least one additional transistor is coupled to the cascade node A, a first electrode of the additional transistor is coupled to a corresponding clock signal terminal, and a second electrode of the additional transistor is coupled to a corresponding additional output signal terminal OUTPUT'. The additional transistor is configured to be turned on under the control of the potential at the cascade node A to transmit a corresponding clock signal to the corresponding additional output signal terminal OUTPUT', so as to scan a gate line coupled to the corresponding additional output signal terminal OUTPUT'.

In a case where each additional output sub-circuit 30 of the at least one additional output sub-circuit 30 includes two additional transistors, a control electrode of each of the two additional transistors is coupled to the cascade node A, a first electrode of each additional transistor is coupled to a corresponding clock signal terminal, and second electrodes of the additional transistors are coupled to a corresponding same additional output signal terminal OUTPUT'. In this way, in a case where one of the two additional transistors fails, the other additional transistor may still be turned on under the control of the potential at the cascade node A to transmit a clock signal from a clock signal terminal coupled to the other additional transistor to the additional output signal terminal OUTPUT' coupled to the other additional transistor. In a case where each additional output sub-circuit 30 of the at least one additional output sub-circuit 30 includes three or more additional transistors, a connection manner thereof is as described above, which will not be repeated herein.

It will be noted that, since a control electrode of one of the at least one additional transistor is coupled to the cascade node A, when the cascade sub-circuit 20 transmits a working voltage of the second clock signal Clkd to the cascade node A under the control of the potential at the pull-up node PU, a voltage of the control electrode of the additional transistor is the working voltage of the second clock signal Clkd. The additional transistor is turned on under the control of the potential at the cascade node A to transmit a working voltage of a corresponding clock signal to an additional output signal terminal OUTPUT' corresponding to the additional transistor.

In a case where the additional transistor is an N-type transistor, if the working voltage of the clock signal (e.g., a third clock signal Clkb input through a third clock signal terminal CLKB in FIG. 3, 4A or 4B, or a fourth clock signal Clkc input through a fourth clock signal terminal CLKC in FIG. 4B) corresponding to the additional transistor is greater than the working voltage of the second clock signal Clkd, a voltage $V_g$, ($V_{gs}$ being less than 0) between the control electrode and a second electrode (a source) of the additional transistor is less than a threshold voltage $V_{th}$ ($V_{th}$ being greater than 0) of the additional transistor. This will cause the additional transistor to be turned off in a process of transmitting the corresponding clock signal, and thus the additional transistor may not output the corresponding clock signal.

On this basis, in some embodiments, in the case where the additional transistor is the N-type transistor, the working voltage of the second clock signal Clkd can be made to be greater than the working voltage of the clock signal (e.g., the third clock signal Clkb, or the fourth dock signal Clkc) corresponding to the additional transistor. For example, the working voltage of the second clock signal Clkd is made to be twice the working voltage of the clock signal (e.g., the third clock signal Clkb, or the fourth clock signal Clkc) corresponding to the additional transistor. In this way, the voltage $V_{gs}$ between the control electrode and the second electrode of the additional transistor is greater than the threshold voltage $V_{th}$ of the additional transistor, Therefore, it is possible to ensure that the additional transistor is not turned off in the process of transmitting the corresponding clock signal, and thus the additional transistor may smoothly output the corresponding clock signal.

In a case where the additional transistor is a P-type transistor, if the working voltage of the clock signal (e.g., the third clock signal CLkb or the fourth clock signal CLkc) corresponding to the additional transistor is less than the working voltage of the second clock signal Clkd, a voltage $V_{gs}$ ($V_{gs}$ being greater than 0) between the control electrode and a first electrode (the source) of the additional transistor is greater than the threshold voltage $V_{th}$ ($V_{th}$ being less than 0) of the additional transistor. This will cause the additional transistor to be turned off in a process of transmitting the corresponding clock signal, and thus the additional transistor may not output the corresponding clock signal.

On this basis, in some embodiments, in the case where the additional transistor is the P-type transistor, the working voltage of the second clock signal Clkd can be made to be less than the working voltage of the clock signal (e.g., the third clock signal Clkb, or the fourth clock signal Clkc) corresponding to the additional transistor. For example, the working voltage of the clock signal (e.g., the third clock signal Clkb, or the fourth clock signal Clkc) corresponding to the additional transistor is made to be twice the working voltage of the second clock signal Clkd. In this way, the voltage $V_{gs}$ between the control electrode and the first electrode of the additional transistor is less than the threshold voltage $V_{th}$ of the additional transistor. Therefore, it is possible to ensure that the additional transistor is not turned off in the process of transmitting the corresponding clock signal, and thus the additional transistor may smoothly output the corresponding clock signal.

In some embodiments, as shown in FIGS. 2A, 2B, 4A and 4B, the shift register SR further includes a pull-up control sub-circuit 40, a pull-down control sub-circuit 50, a cascade pull-down sub-circuit 70, an output pull-down sub-circuit 60, and at least one additional output pull-down sub-circuit 80.

The pull-up control sub-circuit 40 is coupled to an input signal terminal INPUT, a first voltage signal terminal VDD1, the pull-up node PU, a pull-down node PD, and a second voltage signal terminal VGL1. The input signal terminal INPUT is configured to receive an input signal Input, and provide the input signal Input to the pull-up control sub-circuit 40. The first voltage signal terminal VDD1 is configured to receive a first voltage signal Vdd1, and provide the first voltage signal Vdd1 to the pull-up control sub-circuit 40. The second voltage signal terminal VGL1 is configured to receive a second voltage signal Vgl1, and provide the second voltage signal Vgl1 to the pull-up control sub-circuit 40. The pull-up control sub-circuit 40 is configured to transmit the first voltage signal Vdd1 to the pull-up node PU under control of the input signal Input, and transmit the second voltage signal Vgl1 to the pull-up node PU under control of a potential at the pull-down node PD.

The pull-down control sub-circuit 50 is coupled to a third voltage signal terminal VDD2, the pull-down node PD, the pull-up node PU, and the second voltage signal terminal VGL1, The third voltage signal terminal VDD2 is configured to receive a third voltage signal Vdd2, and provide the third voltage signal Vdd2 to the pull-down control sub-circuit 50. The pull-down control sub-circuit 50 is configured to transmit the third voltage signal Vdd2 to the pull-down node PD under control of the third voltage signal Vdd2, and transmit the second voltage signal Vgl1 to the pull-down node PD under the control of the potential at the pull-up node PU.

The cascade pull-down sub-circuit 70 is coupled to the cascade node A, the pull-down node PD, and the second voltage signal terminal VGL1. The cascade pull-down sub-circuit 70 is configured to transmit the second voltage signal Vgl1 to the cascade node A under the control of the potential at the pull-down node PD, so as to reduce noise of a signal at the cascade node A.

The output pull-down sub-circuit 60 is coupled to the output signal terminal OUTPUT1, the pull-down node PD, and a fourth voltage signal terminal VGL2 The fourth voltage signal terminal VGL2 is configured to receive a fourth voltage signal Vgl2, and provide the fourth voltage signal Vgl2 to the output pull-down sub-circuit 60. The output pull-down sub-circuit 60 is configured to transmit the fourth voltage signal Vgl2 to the output signal terminal OUTPUT1 under the control of the potential at the pull-down node PD, so as to reduce noise of a signal at the output signal terminal OUTPUT1.

Each additional output pull-down sub-circuit 80 of the at least one additional output pull-down sub-circuit 80 is coupled to the pull-down node PD, the fourth voltage signal terminal VGL2, and a corresponding additional output signal terminal OUTPUT'. Each additional output pull-down sub-circuit 80 is configured to transmit the fourth voltage signal Vgl2 to a corresponding additional output signal terminal OUTPUT' under the control of the potential at the pull-down node PD, so as to reduce noise of a signal at the corresponding additional output signal terminal OUTPUT'.

It will be noted that, specific structures of the pull-up control sub-circuit 40 and the pull-down control sub-circuit 50 (e.g., arrangements of transistors inside the sub-circuits) included in the shift register SR are not limited in the embodiments of the present disclosure, and may be set according to actual needs, as long as the output signal terminal OUTPUT1 and the at least one additional output signal terminal OUTPUT' may normally output signals by controlling the potential at the pull-up node PU through the pull-up control sub-circuit 40 and the potential at the pull-down node PD through the pull-down control sub-circuit 50.

The control of the pull-up control sub-circuit 40 over the pull-up node PU makes the pull-up node PU have two states, one of which is a working state, such as a high potential (or a low potential), and the other of which is a non-working state, such as a low potential (or a high potential). The control of the pull-down control sub-circuit 50 over the pull-down node PD makes the pull-down node PD have two states, one of which is a working state, such as a high potential (or a low potential), and the other of which is a non-working state, such as a low potential (or a high potential).

The pull-up control sub-circuit 40 controls the state of the pull-up node PU (i.e., the high potential or the low potential), which in turn controls the output sub-circuit 10 to output a scanning signal, or controls, through the cascade sub-circuit 20, the at least one additional output sub-circuit 30 to output a scanning signal. The pull-down control sub-circuit 50 controls the state of the pull-down node PD (i.e., the high potential or the low potential), which in turn controls the output pull-down sub-circuit 60 to reduce the noise of the signal at the output signal terminal OUTPUT1, or controls each additional output pull-down sub-circuit 80 to reduce noise of a signal at a corresponding additional output signal terminal OUTPUT'.

For example, as shown in FIGS. 4A and 4B, the pull-up control sub-circuit 40 includes a third transistor M3 and a fourth transistor M4.

A control electrode of the third transistor M3 is coupled to the input signal terminal INPUT, a first electrode of the third transistor M3 is coupled to the first voltage signal terminal VDD1, and a second electrode of the third transistor M3 is coupled to the pull-up node PU. The third transistor M3 is configured to be turned on under the control of the input signal Input to transmit the first voltage signal Vdd1 to the pull-up node PU.

A control electrode of the fourth transistor M4 is coupled to the pull-down node PD, a first electrode of the fourth transistor M4 is coupled to the second voltage signal terminal VGL1, and a second electrode of the fourth transistor M4 is coupled to the pull-up node PU. The fourth transistor M4 is configured to be turned on under the control of the potential at the pull-down node PD to transmit the second voltage signal Vgl1 to the pull-up node PU.

The pull-down control sub-circuit 50 includes a fifth transistor M5 and a sixth transistor M6.

A control electrode and a first electrode of the fifth transistor M5 are coupled to the third voltage signal terminal VDD2, and a second electrode of the fifth transistor M5 is coupled to the pull-down node PD and a second electrode of the sixth transistor M6 The fifth transistor M5 is configured to be turned on under the control of the third voltage signal Vdd2 to transmit the third voltage signal Vdd2 to the pull-down node PD and the second electrode of the sixth transistor M6.

A control electrode of the sixth transistor M6 is coupled to the pull-up node PU, and a first electrode of the sixth transistor M6 is coupled to the second voltage signal terminal VGL1. The sixth transistor M6 is configured to be turned on under the control of the potential at the pull-up node PU to transmit the second voltage signal Vgl1 to the pull-down node PD.

The cascade pull-down sub-circuit 70 includes an eighth transistor M8. A control electrode of the eighth transistor M8 is coupled to the pull-down node PD, a first electrode of the eighth transistor M8 is coupled to the second voltage signal terminal VGL1, and a second electrode of the eighth transistor M8 is coupled to the cascade node A. The eighth transistor M8 is configured to be turned on under the control of the potential at the pull-down node PD to transmit the second voltage signal Vgl1 to the cascade node A, so as to reduce the noise of the signal at the cascade node A.

The output pull-down sub-circuit 60 includes a ninth transistor M9. A control electrode of the ninth transistor M9 is coupled to the pull-down node PD, a first electrode of the ninth transistor M9 is coupled to the fourth voltage signal terminal VGL2, and a second electrode of the ninth transistor M9 is coupled to the output signal terminal OUTPUT1. The ninth transistor M9 is configured to be turned on under the control of the potential at the pull-down node PD to transmit the fourth voltage signal Vgl2 to the output signal terminal OUTPUT1, so as to reduce the noise of the signal at the output signal terminal OUTPUT1.

Each additional output pull-down sub-circuit 80 of the at least one additional output pull-down sub-circuit 80 includes at least one additional pull-down transistor. A control electrode of one of the at least one additional pull-down transistor (e.g., a twelfth transistor M12 in FIG. 4A, or the twelfth transistor M12 and a fifteenth transistor M15 in FIG. 4B) is coupled to the pull-down node PD, a first electrode of the additional pull-down transistor is coupled to the fourth voltage signal terminal VGL2, and a second electrode of the additional pull-down transistor is coupled to a corresponding additional output signal terminal OUTPUT'. The additional pull-down transistor is configured to be turned on under the control of the potential at the pull-down node PD to transmit the fourth voltage signal Vgl2 to the corresponding additional output signal terminal OUTPUT', so as to reduce noise of a signal at the additional output signal terminal OUTPUT' corresponding to the additional pull-down transistor.

In a case where each additional output pull-down sub-circuit 80 of the at least one additional output pull-down sub-circuit 80 includes two additional pull-down transistors, a control electrode of each of the two additional pull-down transistors is coupled to the pull-down node PD, a first electrode of each additional pull-down transistor is coupled to the fourth voltage signal terminal VGL2, and second electrodes of the additional pull-down transistors are coupled to a corresponding same additional output signal terminal OUTPUT'. In this way, in a case where one of the two additional pull-down transistors fails, the other additional pull-down transistor may still be turned on under the control of the potential at the pull-down node PD to transmit the fourth voltage signal Vgl2 from the fourth voltage signal terminal VGL2 coupled to the other additional pull-down transistor to the additional output signal terminal OUTPUT coupled to the other additional pull-down transistor. In a case where each additional output pull-down sub-circuit 80 of the at least one additional output pull-down sub-circuit 80 includes three or more additional pull-down transistors, a connection manner thereof is as described above, which will not be repeated herein.

In some embodiments, as shown in FIGS. 2A, 2B, 4A and 4B, the shift register SR further includes a first reset sub-circuit 91 and a second reset sub-circuit 92.

The first reset sub-circuit 91 is coupled to a first reset signal terminal RESET1, the pull-up node PU, and the second voltage signal terminal VGL1. The first reset signal terminal RESET1 is configured to receive a first reset signal Reset1, and provide the first reset signal Reset1 to the first reset sub-circuit 91. The first reset sub-circuit 91 is configured to transmit the second voltage signal Vgl1 to the pull-up node PU under control of the first reset signal Reset1.

The second reset sub-circuit 92 is coupled to a second reset signal terminal RESET2, the second voltage signal terminal VGL1, and the cascade node A. The second reset signal terminal RESET2 is configured to receive a second reset signal Reset2, and provide the second reset signal Reset2 to the second reset sub-circuit 92. The second reset sub-circuit 92 is configured to transmit the second voltage signal Vgl1 to the cascade node A under control of the second reset signal Reset2.

For example, as shown in FIGS. 4A and 4B, the first reset sub-circuit 91 includes a seventh transistor M7. A control electrode of the seventh transistor M7 is coupled to the first reset signal terminal RESET1, a first electrode of the seventh transistor M7 is coupled to the second voltage signal terminal VGL1, and a second electrode of the seventh transistor M7 is coupled to the pull-up node PU. The seventh transistor M7 is configured to be turned on under the control of the first reset signal Reset1 to transmit the second voltage signal Vgl1 to the pull-up node PU.

For example, as shown in FIGS. 4A and 4B, the second reset sub-circuit 92 includes a thirteenth transistor M13. A control electrode of the thirteenth transistor M13 is coupled to the second reset signal terminal RESET2, a first electrode of the thirteenth transistor M13 is coupled to the second voltage signal terminal VGL1, and a second electrode of the thirteenth transistor M13 is coupled to the cascade node A. The thirteenth transistor M13 is configured to be turned on under the control of the second reset signal Reset2 to transmit the second voltage signal Vgl1 to the cascade node A.

In some embodiments, as shown in FIGS. 2A, 26, 4A and 4B, the shift register SR further includes a third reset sub-circuit 93. The third reset sub-circuit 93 is coupled to a third reset signal terminal RESET3, the pull-up node PU, and the second voltage signal terminal VGL1 The third reset signal terminal RESET3 is configured to receive a third reset signal Reset3, and provide the third reset signal Reset3 to the third reset sub-circuit 93. The third reset sub-circuit 93 is configured to transmit the second voltage signal Vgl1 to the pull-up node PU under control of the third reset signal Reset3.

For example, as shown in FIGS. 4A and 4B, the third reset sub-circuit 93 includes a tenth transistor M10. A control electrode of the tenth transistor M10 is coupled to the third reset signal terminal RESET3, a first electrode of the tenth transistor M10 is coupled to the second voltage signal terminal VGL1, and a second electrode of the tenth transistor M10 is coupled to the pull-up node PU. The tenth transistor M10 is configured to be turned on under the control of the third reset signal Reset3 to transmit the second voltage signal Vgl1 to the pull-up node PU.

In some embodiments, the shift register SR includes one or two additional output sub-circuits 30.

In a case where the shift register SR includes one additional output sub-circuit 30, for example, as shown in FIG. 2A, the at least one additional output sub-circuit 30 includes a first additional output sub-circuit 301. The first additional output sub-circuit 301 is coupled to the third clock signal terminal CLKB, the cascade node A, and a first additional output signal) terminal OUTPUT1'. The third dock signal terminal CLKB is configured to receive the third clock signal Clkb, and provide the third clock signal Clkb to the first additional output sub-circuit 301. The first additional output sub-circuit 301 is configured to transmit the third clock signal Clkb to the first additional output signal terminal OUTPUT1' under the control of the potential at the cascade node A.

On this basis, a specific circuit structure of the shift register SR provided by the embodiments of the present disclosure will be described below completely and exemplarily.

As shown in FIGS. 2A and 4A, the shift register SR includes the output sub-circuit 10, the cascade sub-circuit 20, and the first additional output sub-circuit 301.

The output sub-circuit 10 includes the first transistor M1. The control electrode of the first transistor M1 is coupled to the pull-up node PU, the first electrode of the first transistor M1 is coupled to the first clock signal terminal CLKA, and the second electrode of the first transistor M1 is coupled to the output signal terminal OUTPUT1. The first transistor M1 is configured to be turned on under the control of the potential at the pull-up node PU to transmit the first clock signal Clka received at the first clock signal terminal CLKA to the output signal terminal OUTPUT1.

The cascade sub-circuit 20 includes the second transistor M2 and the capacitor C.

The control electrode of the second transistor M2 is coupled to the pull-up node PU, the first electrode of the second transistor M2 is coupled to the second clock signal terminal CLKD, and the second electrode of the second transistor M2 is coupled to the cascade node A. The second transistor M2 is configured to be turned on under the control of the potential at the pull-up node PU to transmit the second clock signal Clkd received at the second clock signal terminal CLKD to the cascade node A.

One terminal of the capacitor C is coupled to the pull-up node PU, and the other terminal of the capacitor C is coupled to the cascade node A. The capacitor C is configured to store the voltage at the pull-up node PU during the input phase in the driving process of the shift register SR, and outputs the voltage to the pull-up node PU during the output phase in the driving process of the shift register SR.

The first additional output sub-circuit 301 includes the eleventh transistor M11. A control electrode of the eleventh transistor M11 is coupled to the cascade node A, a first electrode of the eleventh transistor M11 is coupled to the third clock signal terminal CLKB, and a second electrode of the eleventh transistor M11 is coupled to the first additional output signal terminal OUTPUT1'. The eleventh transistor M11 is configured to be turned on under the control of the potential at the cascade node A to transmit the third clock signal Clkb received at the third clock signal terminal CLKB to the first additional output signal terminal OUTPUT1'.

The shift register SR further includes the pull-up control sub-circuit 40, and the pull-up control sub-circuit 40 includes the third transistor M3 and the fourth transistor M4.

The control electrode of the third transistor M3 is coupled to the input signal terminal INPUT, the first electrode of the third transistor M3 is coupled to the first voltage signal terminal VDD1, and the second electrode of the third transistor M3 is coupled to the pull-up node PU. The third transistor M3 is configured to transmit the first voltage signal Vdd1 to the pull-up node PU in response to the input signal Input received at the input signal terminal INPUT.

The control electrode of the fourth transistor M4 is coupled to the pull-down node PD, the first electrode of the fourth transistor M4 is coupled to the second voltage signal terminal VGL1, and the second electrode of the fourth transistor M4 is coupled to the pull-up node PU. The fourth transistor M4 is configured to be turned on under the control of the potential at the pull-down node PD to transmit the second voltage signal Vgl1 received at the second voltage signal terminal VGL1 to the pull-up node PU.

The shift register SR further includes the pull-down control sub-circuit 50, and the pull-down control sub-circuit 50 includes the fifth transistor M5 and the sixth transistor M6.

The control electrode and the first electrode of the fifth transistor M5 are coupled to the third voltage signal terminal VDD2, and the second electrode of the fifth transistor M5 is coupled to the pull-down node PD and the second electrode of the sixth transistor M6. The fifth transistor M5 is configured to transmit the third voltage signal Vdd2 received at the third voltage signal terminal VDD2 to the pull-down node PD and the second electrode of the sixth transistor M6 in response to the third voltage signal Vdd2.

The control electrode of the sixth transistor M5 is coupled to the pull-up node PU, and the first electrode of the sixth transistor M5 is coupled to the second voltage signal terminal VGL1, The sixth transistor M6 is configured to be turned on under the control of the potential at the pull-up node PU to transmit the second voltage signal Vgl1 received at the second voltage signal terminal VGA to the pull-down node PD.

The shift register SR further includes the cascade pull-down sub-circuit 70, and the cascade pull-down sub-circuit 70 includes the eighth transistor M8. The control electrode of the eighth transistor M8 is coupled to the pull-down node PD, the first electrode of the eighth transistor M8 is coupled to the second voltage signal terminal and the second electrode of the eighth transistor M8 is coupled to the cascade node A. The eighth transistor M8 is configured to be turned on under the control of the potential at the pull-down node PD to transmit the second voltage signal Vgl1 received at the second voltage signal terminal VGA to the cascade node A, so as to reduce the noise of the signal at the cascade node A.

The shift register SR further includes the output pull-down sub-circuit 60, and the output pull-down sub-circuit 60 includes the ninth transistor M9. The control electrode of the ninth transistor M9 is coupled to the pull-down node PD, the first electrode of the ninth transistor M9 is coupled to the fourth voltage signal terminal VGL2, and the second electrode of the ninth transistor M9 is coupled to the output signal terminal OUTPUT1. The ninth transistor M9 is configured to be turned on under the control of the potential at the pull-down node PD to transmit the fourth voltage signal Vgl2 received at the fourth voltage signal terminal VGL2 to the output signal terminal OUTPUT1, so as to reduce the noise of the signal at the output signal terminal OUTPUT1.

The shift register SR further includes a first additional output pull-down sub-circuit 801, and the first additional output pull-down sub-circuit 801 includes the twelfth transistor M12. A control electrode of the twelfth transistor M12 is coupled to the pull-down node PD, a first electrode of the twelfth transistor M12 is coupled to the fourth voltage signal terminal VGL2, and a second electrode of the twelfth transistor M12 is coupled to the first additional output signal terminal OUTPUT1'. The twelfth transistor M12 is configured to be turned on under the control of the potential at the pull-down node PD to transmit the fourth voltage signal Vgl2 received at the fourth voltage signal terminal VGL2 to the first additional output signal terminal OUTPUT1', so as to reduce noise of a signal at the first additional output signal terminal OUTPUT1'.

The shift register SR further includes at least one of the first reset sub-circuit 91, the second reset sub-circuit 92, and the third reset sub-circuit 93.

The first reset sub-circuit 91 includes the seventh transistor M7. The control electrode of the seventh transistor M7 is coupled to the first reset signal terminal RESET1, the first electrode of the seventh transistor M7 is coupled to the second voltage signal terminal VGL1, and the second electrode of the seventh transistor M7 is coupled to the pull-up node PU. The seventh transistor M7 is configured to transmit the second voltage signal Vgl1 received at the second voltage signal terminal VGL1 to the pull-up node PU in response to the first reset signal Reset1 received at the first reset signal terminal RESET1.

The second reset sub-circuit 92 includes the thirteenth transistor M13. The control electrode of the thirteenth transistor M13 is coupled to the second reset signal terminal RESET2, the first electrode of the thirteenth transistor M13 is coupled to the second voltage signal terminal VGL1, and the second electrode of the thirteenth transistor M13 is coupled to the cascade node A, The thirteenth transistor M13 is configured to transmit the second voltage signal Vgl1 received at the second voltage signal terminal VGL1 to the cascade node A in response to the second reset signal Reset2 received at the second reset signal terminal RESET2.

The third reset sub-circuit 93 includes the tenth transistor M10. The control electrode of the tenth transistor M10 is coupled to the third reset signal terminal RESET3, the first electrode of the tenth transistor M10 is coupled to the second voltage signal terminal VGL1, and the second electrode of the tenth transistor M10 is coupled to the pull-up node PU. The tenth transistor M10 is configured to transmit the second voltage signal Vgl1 received at the second voltage signal terminal VGL1 to the pull-up node PU in response to the third reset signal Reset3 received at the third reset signal terminal RESET3.

Figure 2B:
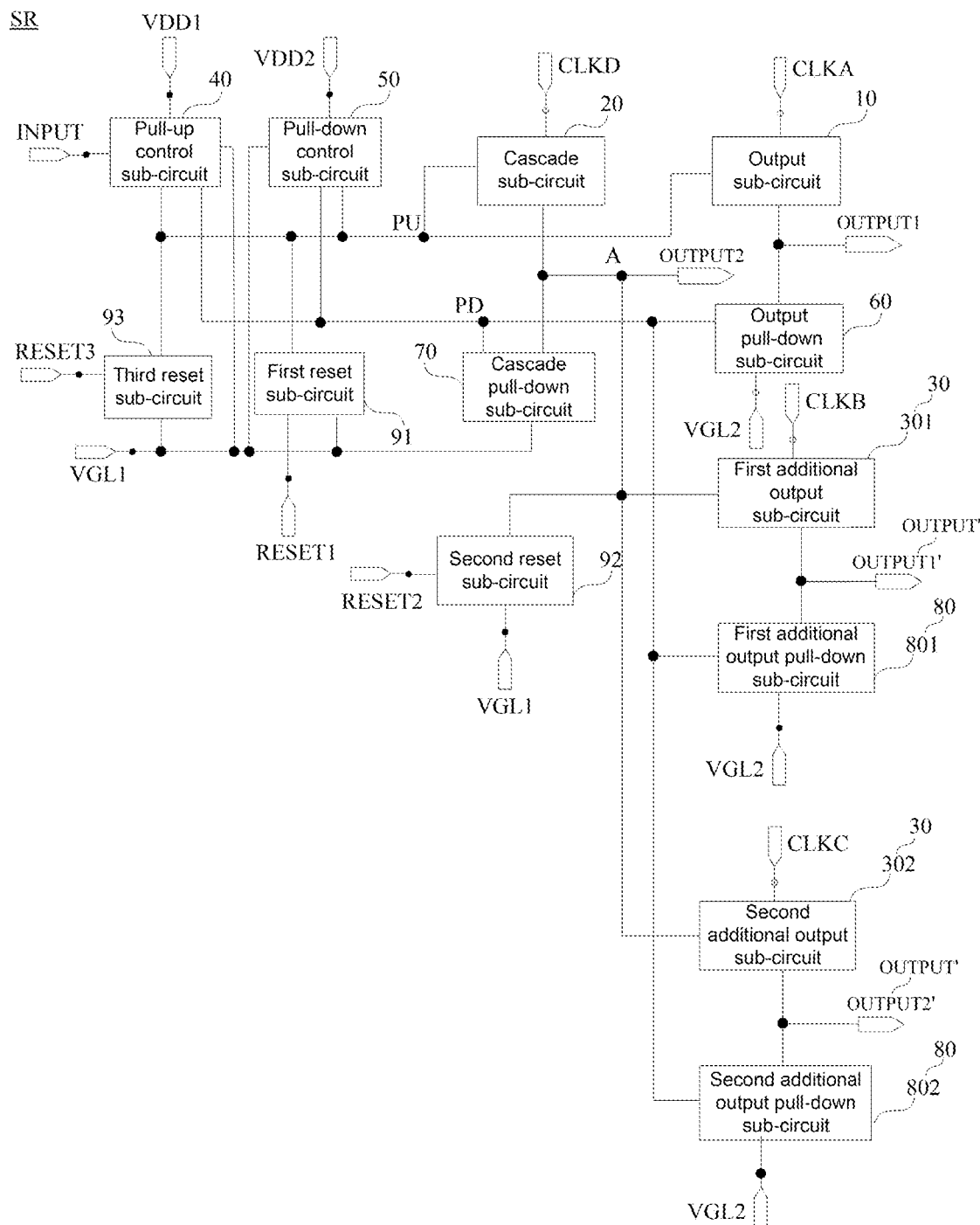
FIG. 2B is a schematic circuit diagram of yet another shift register, in accordance with some embodiments.

In a case where the shift register SR includes two additional output sub-circuits 30, for example, as shown in FIG. 2B, the at least one additional output sub-circuit 30 includes the first additional output sub-circuit 301 and a second additional output sub-circuit 302.

As for a connection structure of the first additional output sub-circuit 301, reference may be made to the foregoing description of the connection structure of the first additional output sub-circuit 301, which will not be repeated herein.

The second additional output sub-circuit 302 is coupled to the fourth clock signal terminal CLKC, the cascade node A, and a second additional output signal terminal OUTPUT2'.

The fourth clock signal terminal CLKC is configured to receive the fourth clock signal Clkc, and provide the fourth clock signal Clkc to the second additional output sub-circuit 302. The second additional output sub-circuit 302 is configured to transmit the fourth clock signal Clkc to the second additional output signal terminal OUTPUT2' under the control of the potential at the cascade node A.

On this basis, a specific circuit structure of the shift register SR provided by the embodiments of the present disclosure will be described below completely and exemplarily.

As shown in FIGS. 2B and 4B, the shift register SR includes the output sub-circuit 10, the cascade sub-circuit 20, the first additional output sub-circuit 301, and the second additional output sub-circuit 302.

As shown in FIG. 4B, the second additional output sub-circuit 302 includes the fourteenth transistor M14. A control electrode of the fourteenth transistor M14 is coupled to the cascade node A, a first electrode of the fourteenth transistor M14 is coupled to the fourth clock signal terminal CLKC, and a second electrode of the fourteenth transistor M14 is coupled to the second additional output signal terminal OUTPUT2'. The fourteenth transistor M14 is configured to transmit the fourth clock signal Clkc received at the fourth clock signal terminal CLKC to the second additional output signal terminal OUTPUT2' under the control of the potential at the cascade node A.

Except the second additional output sub-circuit 302, as for specific circuit structures of the output sub-circuit 10, the cascade sub-circuit 20, and the first additional output sub-circuit 301, reference may be made to the foregoing description of the specific circuit structures of the output sub-circuit 10, the cascade sub-circuit 20, and the first additional output sub-circuit 301, respectively, which will not be repeated herein.

As shown in FIGS. 2B and 4B, the shift register SR further includes the pull-up control sub-circuit 40, the pull-down control sub-circuit 50, the cascade pull-down sub-circuit 70, the output pull-down sub-circuit 60, the first additional output pull-down sub-circuit 801, a second additional output pull-down sub-circuit 802, the first reset sub-circuit 91, the second reset sub-circuit 92 and the third reset sub-circuit 93.

The second additional output pull-down sub-circuit 802 includes the fifteenth transistor M15. A control electrode of the fifteenth transistor M15 is coupled to the pull-down node PD, a first electrode of the fifteenth transistor M15 is coupled to the fourth voltage signal terminal VGL2, and a second electrode of the fifteenth transistor M15 is coupled to the second additional output signal terminal OUTPUT2'. The fifteenth transistor M15 is configured to be turned on under the control of the potential at the pull-down node PD to transmit the fourth voltage signal Vgl2 received at the fourth voltage signal terminal VGL2 to the second additional output signal terminal OUTPUT2', so as to reduce noise of a signal at the second additional output signal terminal OUTPUT2'.

Except the second additional output pull-down sub-circuit 802, as for specific circuit structures of the pull-up control sub-circuit 40, the pull-down control sub-circuit 50, the cascade pull-down sub-circuit 70, the output pull-down sub-circuit 60, the first additional output pull-down sub-circuit 801, the first reset sub-circuit 91, the second reset sub-circuit 92 and the third reset sub-circuit 93, reference may be made to the foregoing description of the corresponding specific circuit structures, which will not be repeated herein.

It will be noted that, in some embodiments, the control electrode of each transistor mentioned in the embodiments of the present disclosure is a gate of the transistor. A source and a drain of each transistor may be symmetrical in structure. In the embodiments of the present disclosure, in order to distinguish two electrodes of the transistor except the gate, one of the source and the drain of the transistor is described as the first electrode, and the other is described as the second electrode. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In addition, in the circuit structures provided by the embodiments of the present disclosure, each transistor may be an N-type transistor or a P-type transistor, which is not limited herein.

Figure 5:
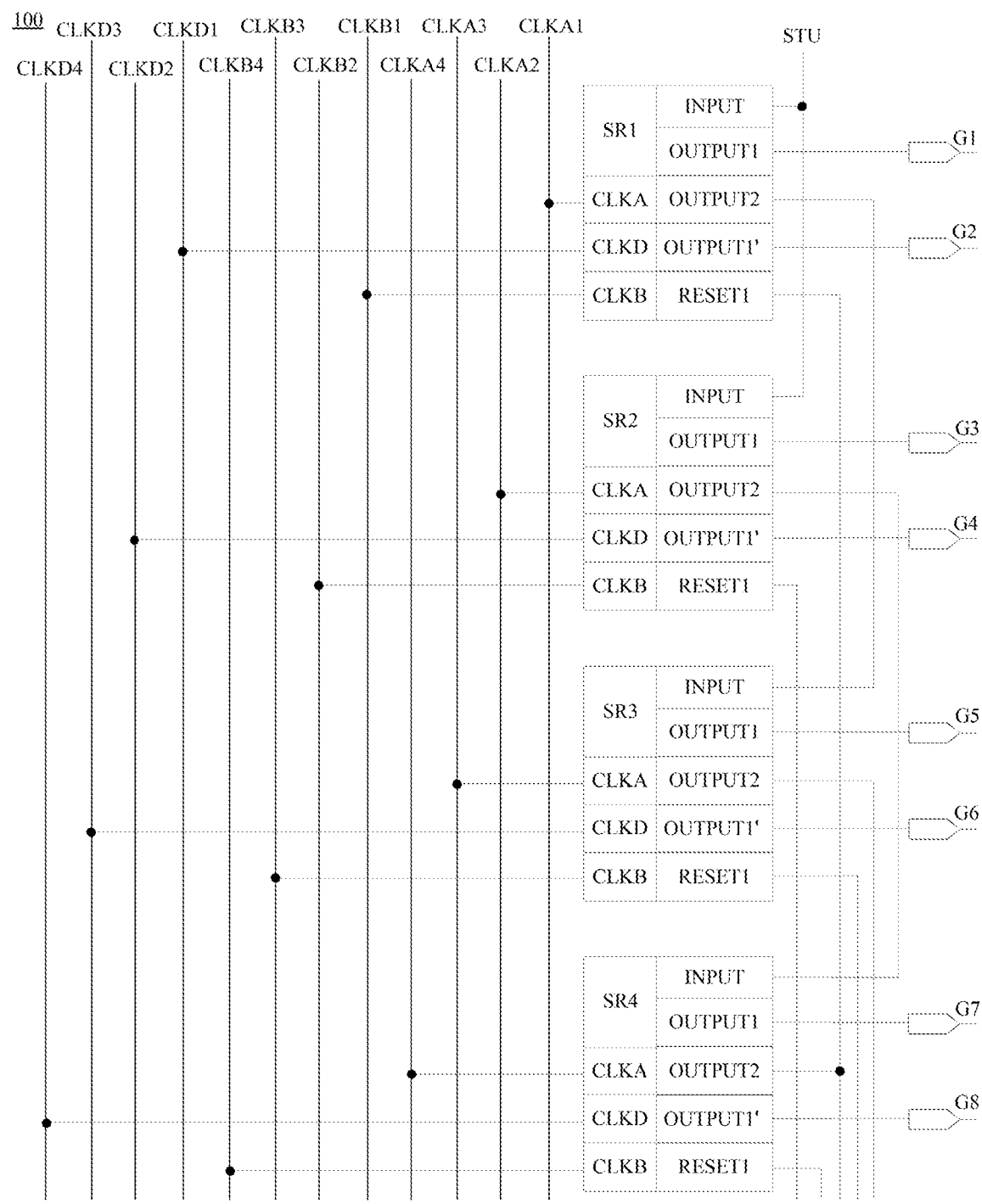
FIG. 5 is a schematic diagram of a cascaded structure of a gate driver circuit, in accordance with some embodiments.

As shown in FIG. 5, some embodiments of the present disclosure provide a gate driver circuit 100. The gate driver circuit 100 includes a plurality of shift registers SR that are cascaded, and each shift register SR is the shift register SR described in the above embodiments.

On this basis, since each shift register SR is provided with one output signal terminal OUTPUT1 and at least one additional output signal terminal OUTPUT' therein, in a case where the number of the gate lines to be scanned remains unchanged, the number of the shift registers SR in the gate driver circuit 100 is reduced. Therefore, not only may the gate driver circuit 100 normally transmit the scanning signals to the gate lines stage-by-stage, but also the space occupied by the gate driver circuit 100 may be saved, thereby facilitating the narrow bezel design of the display device.

In some embodiments, each shift register SR has an input signal terminal INPUT, a first reset signal terminal RESET1, and a cascade signal output terminal OUTPUT2 coupled to a cascade node A.

In the gate driver circuit 100, input signal terminals INPUT of first two stage shift registers SR are both coupled to a frame start signal terminal STU.

Except the first two stage shift registers SR, an input signal terminal INPUT of an Nth-stage shift register SR is coupled to a cascade signal output terminal OUTPUT2 of a (N−2)th-stage shift register SR.

Except last three stage shift registers SR, a first reset signal terminal RESET1 of the Nth-stage shift register SR is coupled to a cascade signal output terminal OUTPUT2 of a (N+3)th-stage shift register SR.

As shown in FIG. 5, an input signal terminal INPUT of a first-stage shift register SR1 and an input signal terminal INPUT of a second-stage shift register SR2 are coupled to the frame start signal terminal STU. The frame start signal terminal STU is configured to receive a start signal Stu, and provide the start signal Stu to the first-stage shift register SR1 and the second-stage shift register SR2. In some embodiments, the start signal Stu received by the frame start signal terminal STU is a pulse signal separately provided by a power supply system of a display panel. In some other embodiments, the start signal Stu is obtained through simulation by using dummy shift register(s) SR in the display panel.

In some embodiments, neither the first-stage shift register SR1 nor the second-stage shift register SR2 is provided with a second reset sub-circuit 92 and a third reset sub-circuit 93 therein, and the first-stage shift register SR1 and the second-stage shift register SR2 are reset only through respective first reset signals Reset1 provided by respective first reset signal terminals RESET1 coupled to respective first reset sub-circuits 91. Except the first-stage shift register SR1 and the second-stage shift register SR2, shift registers SR in other stages are each provided with a second reset sub-circuit 92 and a third reset sub-circuit 93 therein. In this case, the start signals Stu output from the frame start signal terminal STU are further used as second reset signals Reset2 and third reset signals Reset3 of the shift registers SR in the other stages.

First reset signal terminals RESET1 of the last three stage shift registers are coupled to three different termination signal terminals in one-to-one correspondence. Each termination signal terminal is configured to provide a termination signal for a first reset signal terminal RESET1 of a corresponding shift register. In some embodiments, the termination signal output from the termination signal terminal may be a pulse signal provided by the power supply system of the display panel. In some other embodiments, the termination signal output from the termination signal terminal is obtained through simulation by using dummy shift register(s) SR in the display panel.

In some embodiments, a coupling relationship between every four stage shift registers SR in the gate driver circuit 100 and corresponding clock signal lines is a cycle. In a case where a shift register SR of each stage in the gate driver circuit 100 includes the first additional output sub-circuit 301, as shown in FIG. 5, the gate driver circuit 100 further includes twelve clock signal lines. Each shift register SR has the first clock signal terminal CLKA, the second clock signal terminal CLKD, and the third clock signal terminal CLKB. The plurality of shift registers SR in the gate driver circuit 100 are divided into a plurality of groups of shift registers SR. Each group of shift registers SR includes four shift registers SR adjacent successively, and clock signal terminals of the four shift registers SR in the group of shift registers SR are coupled to the twelve clock signal lines, respectively.

For example, the twelve clock signal lines include CLKA1, CLKA2, CLKA3, CLKA4, CLKB1, CLKB2, CLKB3, CLKB4, CLKD1, CLKD2, CLKD3, and CLKD4. The gate driver circuit 100 includes n stages of shift registers SR, and the n stages of shift registers SR are divided into (n/4) groups, which are a first group of shift registers SR to an (n/4)th group of shift registers SR.

The first group of shift registers SR includes a first shift register SR1, a second shift register SR2, a third shift register SR3, and a fourth shift register SR4; . . . ; the (n/4)th group of shift registers SR (not shown in the figure) includes an (n−3)th shift register SR(n−3), an (n−2)th shift register SR(n−2), an (n−1)th shift register SR(n−1), and an nth shift register SRn, wherein n is greater than or equal to 8, and n is an integer multiple of 4.

A first clock signal terminal CLKA of the first shift register SR1 is coupled to the clock signal line CLKA1, a second clock signal terminal CLKD of the first shift register SR1 is coupled to the clock signal line CLKD1, and a third clock signal terminal CLKB of the first shift register SR1 is coupled to the clock signal line CLKB1. A first clock signal terminal CLKA of the second shift register SR2 is coupled to the clock signal line CLKA2, a second clock signal terminal CLKD of the second shift register SR2 is coupled to the clock signal line CLKD2, and a third clock signal terminal CLKB of the second shift register SR2 is coupled to the clock signal line CLKB2. A first clock signal terminal CLKA of the third shift register SR3 is coupled to the clock signal line CLKA3, a second clock signal terminal CLKD of the third shift register SR3 is coupled to the clock signal line CLKD3, and a third clock signal terminal CLKB of the third shift register SR3 is coupled to the clock signal line CLKB3. A first clock signal terminal CLKA of the fourth shift register SR4 is coupled to the clock signal line CLKA4, a second clock signal terminal CLKD of the fourth shift register SR4 is coupled to the clock signal line CLKD4, and a third clock signal terminal CLKB of the fourth shift register SR4 is coupled to the clock signal line CLKB4.

Similarly, a first clock signal terminal CLKA of the (n−3)th shift register SR(n−3) is coupled to the clock signal line CLKA1, a second clock signal terminal CLKD of the (n−3)th shift register SR(n−3) is coupled to the clock signal line CLKD1, and a third clock signal terminal CLKB of the (n−3)th shift register SR(n−3) is coupled to the clock signal line CLKB1. A first clock signal terminal CLKA of the (n−2)th shift register SR(n−2) is coupled to the clock signal line CLKA2, a second clock signal terminal CLKD of the (n−2)th shift register SR(n−2) is coupled to the clock signal line CLKD2, and a third clock signal terminal CLKB of the (n−2)th shift register SR(n−2) is coupled to the clock signal line CLKB2. A first clock signal terminal CLKA of the (n−1)th shift register SR(n−1) is coupled to the clock signal line CLKA3, a second clock signal terminal CLKD of the (n−1)th shift register SR(n−1) is coupled to the clock signal line CLKD3, and a third clock signal terminal CLKB of the (n−1)th shift register SR(n−1) is coupled to the clock signal line CLKB3. A first clock signal terminal CLKA of the nth shift register SRn is coupled to the clock signal line CLKA4, a second clock signal terminal CLKD of the nth shift register SRn is coupled to the clock signal line CLKD4, and a third clock signal terminal CLKB of the nth shift register SRn is coupled to the clock signal line CLKB4.

Figure 7:
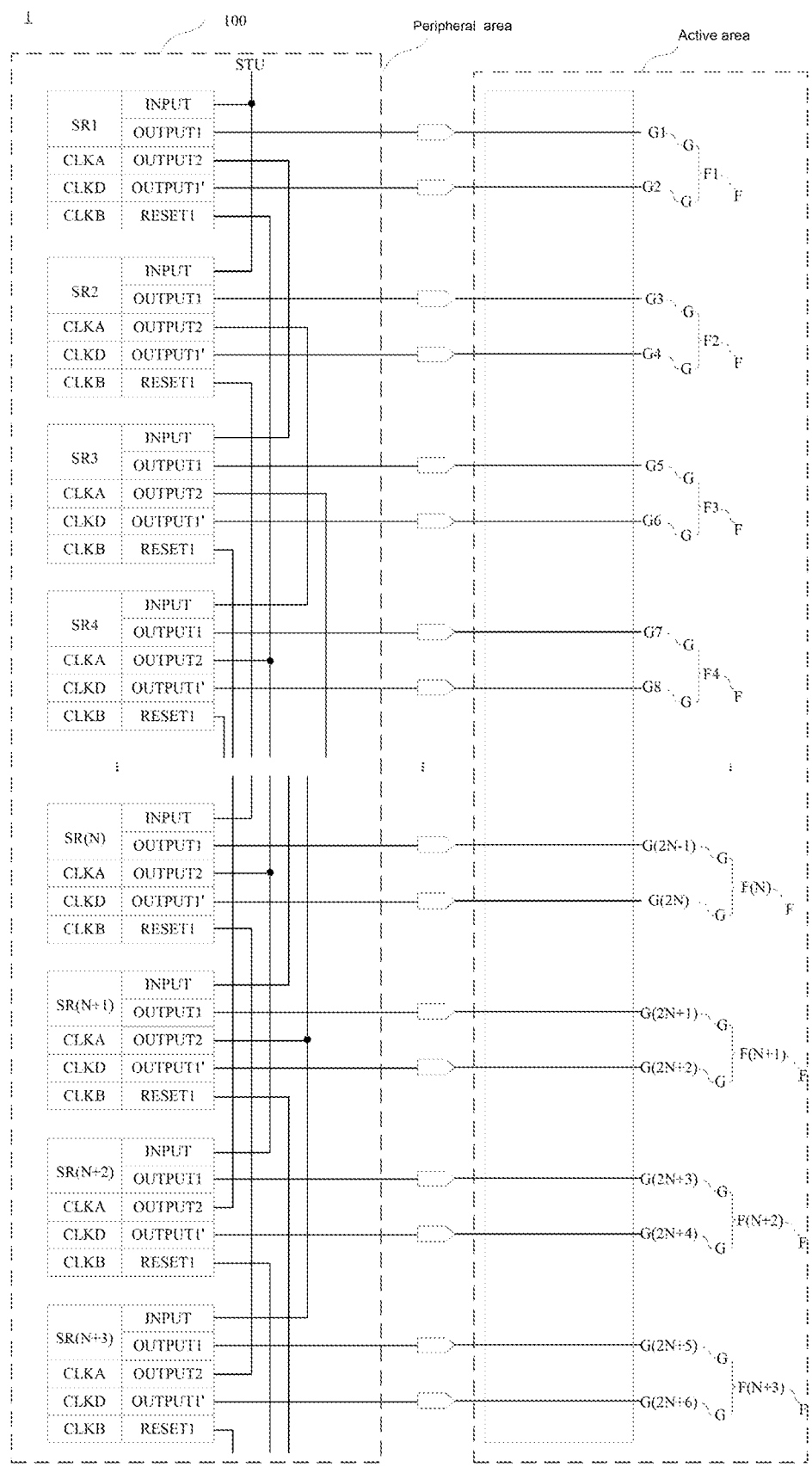
FIG. 7 is a schematic diagram for a display device, in accordance with some embodiments.

As shown in FIG. 7, some embodiments of the present disclosure provide a display device 1, and the display device 1 includes a plurality of gate lines G and the gate driver circuit 100 described in the above embodiments. In the display device 1, the plurality of gate lines G are divided into a plurality of gate line groups F, and each gate line group F includes at least two gate lines G arranged in sequence. The plurality of stages of shift registers SR in the gate driver circuit 100 each correspond to a respective one of the plurality of gate line groups F, and the output signal terminal OUTPUT1 and the at least one additional output signal terminal OUTPUT in each stage of shift register SR are coupled to at least two gate lines G in a corresponding gate line group F.

For example, the display device has an active area (AA) and a peripheral area. The display device 1 includes 2n gate lines G arranged in the active area, and the gate driver circuit 100 disposed in the peripheral area.

The 2n gate lines G are divided into n gate line groups F, which are a first gate line group F1 to an nth gate line group Fn. Each gate line group F includes two adjacent gate lines G. For example, the first gate line group F1 includes a first gate line G1 and a second gate line G2, a second gate line group F2 includes a third gate line G3 and a fourth gate line G4, . . . , an (n−1)th gate line group F(n−1) includes a (2n−3)th gate line G(2n−3) and a (2n−2)th gate line G(2n−2), and the nth gate line group Fn includes a (2n−1)th gate line G(2n−1) and a (2n)th gate line Gln.

The gate driver circuit 100 includes n stages of shift registers SR, which are the first shift register SR1 to the nth shift register SRn, and the n stages of shift registers SR each correspond to a respective one of the n gate line groups F1 to Fn. For example, the first shift register SR1 corresponds to the first gate line group F1, the second shift register SR2 corresponds to the second gate line group F2, an (n−1)th-stage shift register SR(n−1) corresponds to the (n−1)th gate line group F(n−1), and an nth-stage shift register SRn corresponds to the nth gate line group Fn.

Each stage of shift register SR includes the output signal terminal OUTPUT1 and the first additional output signal terminal OUTPUT1'. The output signal terminal OUTPUT1 of the shift register SR in each stage is coupled to one gate line G in a corresponding gate line group F. The first additional output signal terminal OUTPUT1' of the shift register SR in this stage is coupled to the other gate line G in the corresponding gate line group F. For example, an output signal terminal OUTPUT1 in the first shift register SR1 is coupled to the first gate line G1 in the first gate line group F1, and a first additional output signal terminal OUTPUT1' in the first shift register SR1 is coupled to the second gate line G2 in the first gate line group F1.

Figure 6:
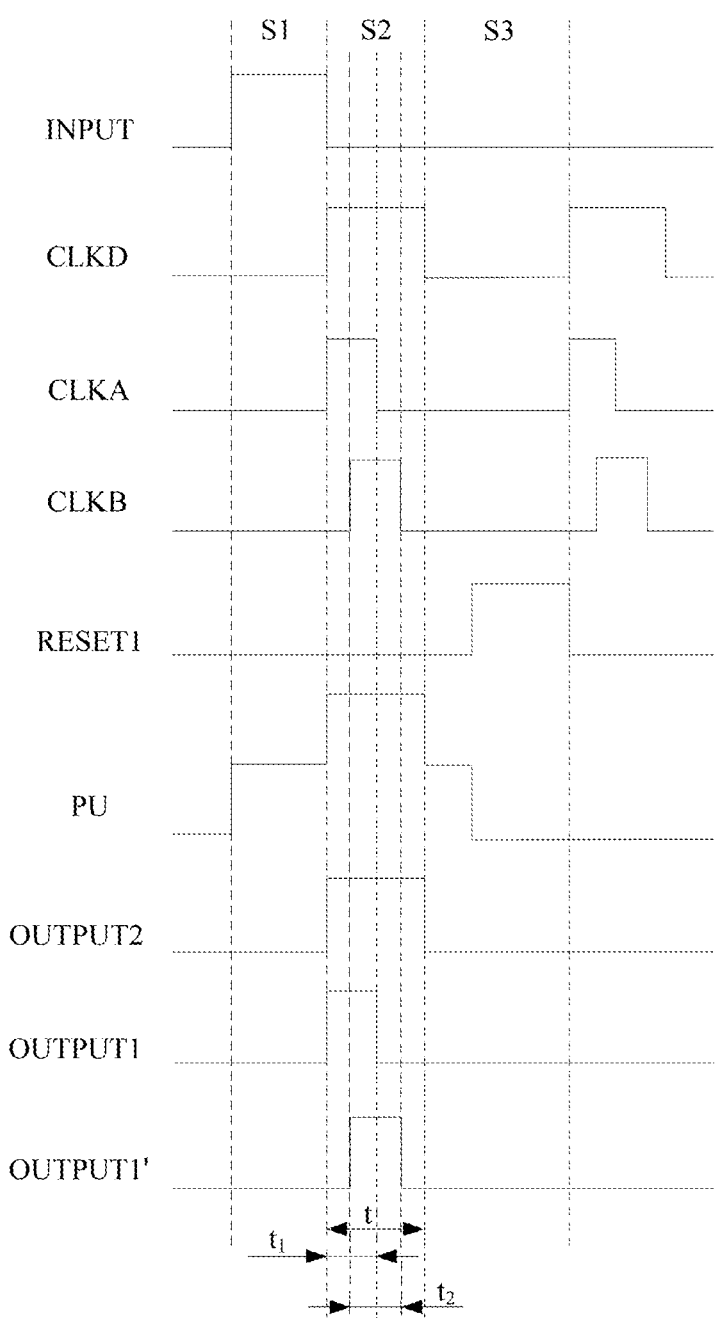
FIG. 6 is a diagram showing control timing signals of a shift register, in accordance with some embodiments.

Some embodiments of the present disclosure provide a driving method for the shift register SR, and the driving method for the shift register SR is configured to drive the shift register SR described in the above embodiments. The driving method has a plurality of frame cycles. As shown in FIG. 6, each frame cycle includes a first period S1, a second period S2, and a third period 33.

In the first period S1:

With reference to FIGS. 2A, 2B and 6, the pull-up control sub-circuit 40 receives the input signal Input and transmits the first voltage signal Vdd1 to the pull-up node PU, and the cascade sub-circuit 20 stores the voltage at the pull-up node PU. Under the control of the potential at the pull-up node PU, the output sub-circuit 10 and the cascade sub-circuit 20 are turned on, to transmit the first clock signal Clka received at the first clock signal terminal CLKA and the second clock signal Clkd received at the second clock signal terminal CLKD to the output signal terminal OUTPUT1 and the cascade node A, respectively.

In this case, the first clock signal Clka and the second clock signal Clkd are both at non-working levels, and the at least one additional output sub-circuit 30 in the shift register SR is turned off under the control of the potential at the cascade node A. In same embodiments, in a case where the at least one additional output sub-circuit 30 includes the first additional output sub-circuit 301, the first additional output sub-circuit 301 is turned off under the control of the potential at the cascade node A.

For example, with reference to FIGS. 4A, 4B and 6, in the first period S1, the third transistor M3 receives the input signal Input input from the input signal terminal INPUT (the input signal terminal INPUT of the first-stage shift register SR1 and the input signal terminal INPUT of the second-stage shift register SR2 receive the start signal provided by the frame start signal terminal STU, and the start signal is used as the input signal Input of the first-stage shift register SR1 and the second-stage shift register SR2). The third transistor M3 is turned on under the control of the input signal Input, to transmit a voltage of the first voltage signal Vdd1 received at the first voltage signal terminal VDD1 to the pull-up node PU. The voltage of the first voltage signal Vdd1 is stored in the capacitor C of the cascade sub-circuit 20.

Moreover, under the control of the potential at the pull-up node PU, the first transistor M1 and the second transistor M2 are turned on. The first transistor M1 transmits a non-working voltage (a low potential) of the first clock signal Clka received at the first clock signal terminal CLKA to the output signal terminal OUTPUT1, and the second transistor M2 transmits a non-working voltage (a low potential) of the second clock signal Clkd received at the second clock signal terminal CLKD to the cascade node A. In this case, the voltage of the first clock signal Clka and the voltage of the second clock signal Clkd are both the non-working voltages, and the eleventh transistor M11 in the first additional output sub-circuit 301 is turned off under the control of the potential at the cascade node A.

In the second period S2:

With reference to FIGS. 2A, 2B and 6, the cascade sub-circuit 20 discharges the pull-up node PU. Under the control of the potential at the pull-up node PU, the output sub-circuit 10 is turned on to transmit the first clock signal Clka to the output signal terminal OUTPUT1 to scan the gate line coupled to the output signal terminal OUTPUT1, and the cascade sub-circuit 20 is turned on to transmit the second clock signal Clkd to the cascade node A.

In this case, the first clock signal Clka and the second clock signal Clkd are both at working levels. Each additional output sub-circuit 30 is turned on under the control of the potential at the cascade node A, to transmit a clock signal received at a corresponding clock signal terminal to a corresponding additional output signal terminal OUTPUT', so as to scan a gate line coupled to the corresponding additional output signal terminal OUTPUT'.

In some embodiments, in the case where the at least one additional output sub-circuit 30 includes the first additional output sub-circuit 301, the first additional output sub-circuit 301 is turned on under the control of the potential at the cascade node A to transmit the third clock signal Clkb received at the third clock signal terminal CLKB to the first additional output signal terminal OUTPUT1', so as to scan a gate line coupled to the first additional output signal terminal OUTPUT1'.

For example, as shown in FIG. 6, in the second period S2, the input signal Input received at the input signal terminal INPUT is at a low level. Under control of the low level of the input signal Input, the third transistor M3 is turned off, and the pull-up node PU is floating.

In this case, the potential of the second clock signal Clkd is changed from the low potential to a high potential. Under the control of the potential at the pull-up node PU, the second transistor M2 is still turned on to transmit the second clock signal Clkd (the high potential) to the cascade node A. A potential at a terminal, coupled to the cascade node A, of the capacitor C in the cascade sub-circuit 20 is changed from a low potential to a high potential. Since the capacitor C has a characteristic of capacitance bootstrapping, a potential at a terminal of the capacitor C coupled to the pull-up node PU will rise under action of the second clock signal Clkd (the high potential), so that the potential at the pull-up node PU continuously rises.

In this case, under the control of the potential at the pull-up node PU, the second transistor remains on to transmit a working voltage (a high potential) of the second clock signal Clkd received at the second clock signal terminal CLKD as a cascade signal Output2 to the cascade signal output terminal OUTPUT2 coupled to the cascade node A. Similarly, the first transistor M1 is turned on under the control of the potential at the pull-up node PU to transmit a working voltage (a high potential) of the first clock signal Clka received at the first clock signal terminal CLKA as a scanning signal to the output signal terminal OUTPUT1.

In this case, each of the at least one additional transistor in each additional output sub-circuit 30 of the at least one additional output sub-circuit 30 is turned on under the control of the potential (the high potential) at the cascade node A, to transmit a working voltage (a high potential) of a corresponding clock signal received at a corresponding clock signal terminal as a scanning signal to a corresponding additional output signal terminal OUTPUT'.

For example, as shown in FIGS. 4A and 4B, the at least one additional output sub-circuit 30 includes the first additional output sub-circuit 301, and the first additional output sub-circuit 301 includes the eleventh transistor M11. A dock signal terminal corresponding to the first additional output sub-circuit 301 is the third clock signal terminal CLKB, and an additional output signal terminal OUTPUT' corresponding to the first additional output sub-circuit 301 is the first additional output signal terminal OUTPUT1'. In this case, the eleventh transistor M11 is turned on under the control of the potential (the high potential) at the cascade node A, to transmit a working voltage (a high potential) of the third clock signal Clkb received at the third clock signal terminal CLKB as a scanning signal to the first additional output signal terminal OUTPUT1'.

In some possible designs, as shown in FIG. 6, in the second period S2, a period when the voltage of the second clock signal Clkd at the second clock signal terminal CLKD is the working voltage is t, a period when the voltage of the first clock signal Clka is the working voltage is $t_1$, and a period when the voltage of the third clock signal Clkb is the working voltage is $t_2$. A start time of t is not later than a start time of $t_1$, and an end time of t is not earlier than an end time of $t_2$. In this way, when the first transistor M1 outputs the first clock signal Clka and the eleventh transistor M11 outputs the third clock signal Clkb, the second clock signal Clkd enables the cascade node A and the terminal of the capacitor C coupled to the pull-up node PU to be continuously at a high potential, thereby ensuring that the first transistor M1 and the eleventh transistor M11 are not turned off when transmitting the working voltage of the first clock signal Clka and the working voltage of the third clock signal Clkb, respectively.

In some possible designs, as shown in FIG. 6, a start time of $t_2$ is earlier than an end time of the $t_1$. That is, before the output of the working voltage of the first clock signal Clka is ended, the output of the working voltage of the third clock signal Clkb has been started. In this way, it may be ensured that after the scanning signal output from the output signal terminal OUTPUT1 (i.e., the working voltage of the first clock signal Clka) scans the corresponding gate line, the scanning signal output from the first additional output signal terminal OUTPUT1' (i.e., the working voltage of the third clock signal Clkb) may immediately scan the corresponding gate line. In this way, a sequential and consecutive output of scanning signals from adjacent output signal terminal and additional output signal terminal (OUTPUT1 and OUTPUT1') may be ensured, thereby achieving a progressive and consecutive scanning of the gate lines in the display device, and making an image displayed on the display device smooth.

In a case where the shift register SR further includes the first reset sub-circuit 91, the driving method further includes the following steps.

In the third period S3:

With reference to FIGS. 2A, 2B and 6, the first reset sub-circuit 91 receives the first reset signal Resets, and transmits the second voltage signal Vgl1 to the pull-up node PU to reset the cascade sub-circuit 20 and the output sub-circuit 10. The output sub-circuit 10 and the cascade sub-circuit 20 are turned off under the control of the potential at the pull-up node PU.

In this case, each additional output sub-circuit is turned under the control of the potential at the cascade node A.

Under the control of the potential at the pull-down node PD, the output pull-down sub-circuit 60 is turned on to transmit the fourth voltage signal Vgl2 to the output signal terminal OUTPUT1, so as to reduce the noise of the signal at the output signal terminal, and the cascade pull-down sub-circuit 70 is turned on to correspondingly transmit the second voltage signal Vgl1 to the cascade node A, so as to reduce the noise of the signal at the cascade node A. In this case, under the control of the potential at the pull-down node PD, each additional output pull-down sub-circuit 80 is turned on to transmit the fourth voltage signal Vgl2 to a corresponding additional output signal terminal OUTPUT', so as to reduce noise of a signal at the corresponding additional output signal terminal OUTPUT'. In some embodiments, in a case where the at least one additional output pull-down sub-circuit 80 includes the first additional output pull-down sub-circuit 801, the first additional output pull-down sub-circuit 801 transmits the fourth voltage signal Vgl2 to the first additional output signal terminal OUTPUT1' under the control of the potential at the pull-down node PD, so as to reduce the noise of the signal at the first additional output signal terminal OUTPUT1'.

For example, in this period, the seventh transistor M7 receives the first reset signal Reset1 input from the first reset signal terminal RESET1. Under the control of the first reset signal Reset1, the seventh transistor M7 is turned on to transmit a voltage of the second voltage signal Vgl1 received at the second voltage signal terminal VGL1 to the pull-up node PU, so as to reset the first transistor M1 and the second transistor M2. The first transistor M1 and the second transistor M2 are turned off under the control of the potential at the pull-up node PU.

Moreover, in this period, as shown in FIGS. 4A and 4B, the potential at the pull-up node PU is a low potential. The sixth transistor M6 in the pull-down control sub-circuit 50 is turned off under the control of the potential at the pull-up node PU. In response to the third voltage signal Vdd2 received at the third voltage signal terminal VDD2, the fifth transistor M5 in the pull-down control sub-circuit 50 transmits the third voltage signal Vdd2 (a high potential) to the pull-down node PD to ensure that the pull-down node PD is at the high potential. Under the control of the potential at the pull-down node PD, the eighth transistor M8 is turned on to transmit the second voltage signal Vgl1 to the cascade node A, so as to reduce the noise of the signal at the cascade node A, and the ninth transistor M9 is turned on to transmit the fourth voltage signal Vgl2 to the output signal terminal OUTPUT1, so as to reduce the noise of the signal at the output signal terminal OUTPUT1.

In this case, under the control of the potential at the pull-down node PD, each additional output pull-down sub-circuit 80 is turned on to transmit the fourth voltage signal Vgl2 to a corresponding additional output signal terminal OUTPUT', so as to reduce noise of a signal at the corresponding additional output signal terminal OUTPUT'.

For example, as shown in FIG. 4A, the at least one additional output pull-down sub-circuit 80 includes the first additional output pull-down sub-circuit 801, and the first additional output pull-down sub-circuit 801 includes the twelfth transistor M12. Under the control of the potential (the high potential) at the pull-down node PD, the twelfth transistor M12 is turned on to transmit a voltage of the fourth voltage signal Vgl2 received at the fourth voltage signal terminal VGL2 to the first additional output signal terminal OUTPUT1', so as to reduce the noise of the signal at the first additional output signal terminal OUTPUT1'.

In some embodiments, as shown in FIG. 6, at a beginning of the third period S3, the pull-up node PU is still maintained at a high potential for a period of time. In this case, the output signal terminal OUTPUT1 outputs the non-working voltage (the low potential) of the first clock signal Clka, and the first additional output signal terminal OUTPUT1' outputs a non-working voltage (a low potential) of the third clock signal Clkb. In this way, in a case where it is ensured that the voltage output from the output signal terminal OUTPUT1 and the voltage output from the first additional output signal terminal OUTPUT1' are the non-working voltages, the first reset sub-circuit 91 may reset the output sub-circuit 10 and the cascade sub-circuit 20, thereby further enhancing a noise reduction effect on the signal at the output signal terminal OUTPUT1 and the signal at the first additional output signal terminal OUTPUT1'.

It will be noted that, the "working voltage" of the shift register provided in the embodiments of the present disclosure refers to a voltage capable of causing a transistor to be operated included in the shift register to be turned on. Accordingly, the "non-working voltage" refers to a voltage incapable of causing a transistor to be operated included in the shift register to be turned on (i.e., the transistor being turned off). Depending on factors such as the type (the N-type or the P-type) of the transistors in the circuit structure of the shift register SR, the working voltage may be higher or lower than the non-working voltage. Generally, a square wave pulse signal is used during operation of the shift register SR. The working voltage corresponds to a voltage of a square wave pulse portion of the square wave pulse signal, and the non-working voltage corresponds to a voltage of a non-square wave pulse portion.

In addition, the driving method is described by taking an example in which each transistor in the shift register SR is an N-type transistor. However, this cannot be regarded as a limitation on the shift register SR to which the driving method is applied. In a case where the transistors in the shift register SR are P-type transistors, or a part of the transistors are P-type transistors, and a remaining part of the transistors are N-type transistors, a corresponding driving method may be substantially obtained by simply changing a high potential and a low potential or a timing of each signal in the above driving method, which will not be described in detail in the embodiments of the present disclosure.

In the description of the above embodiments, specific features, structures, materials or characteristics may be combined in any suitable manner in any one or mare embodiments or examples.

The forgoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims,

What is claimed is:

1. A shift register, comprising an output sub-circuit, a cascade sub-circuit, one or more additional output sub-circuits, a pull-up control sub-circuit, a pull-down control sub-circuit, a cascade pull-down sub-circuit, an output pull-down sub-circuit and at least one additional output pull-down sub-circuit, wherein the output sub-circuit is coupled to a first clock signal terminal, a pull-up node, and an output signal terminal, and is configured to transmit a first clock signal received at the first clock signal terminal to the output signal terminal under control of a potential at the pull-up node, so as to scan a gate line coupled to the output signal terminal;

the cascade sub-circuit is coupled to a second clock signal terminal, the pull-up node, and a cascade node, and is configured to transmit a second clock signal received at the second clock signal terminal to the cascade node under the control of the potential at the pull-up node;

in a case where the shift register comprises a first additional output sub-circuit, the first additional output sub-circuit is coupled to a third clock signal terminal, the cascade node, and a first additional output signal terminal;

in a case where the shift register further comprises a second additional output sub-circuit, the second additional output sub-circuit is coupled to a fourth clock signal terminal, the cascade node, and a second additional output signal terminal;

each additional output sub-circuit, of the one or more additional output sub-circuits, is configured to transmit a clock signal received at a corresponding clock signal terminal of the third clock signal terminal or the fourth clock signal terminal to the corresponding additional output signal terminal of the first additional output signal terminal or the second additional output signal terminal under control of a potential at the cascade node, so as to scan a gate line coupled to the corresponding additional output signal terminal;

the pull-up control sub-circuit is coupled to an input signal terminal, a first voltage signal terminal, the pull-up node, a pull-down node, and a second voltage signal terminal, and is configured to transmit a first voltage signal received at the first voltage signal terminal to the pull-up node in response to an input signal received at the input signal terminal, and transmit a second voltage signal received at the second voltage signal terminal to the pull-up node under control of a potential at the pull-down node;

the pull-down control sub-circuit is coupled to a third voltage signal terminal, the pull-down node, the pull-up node, and the second voltage signal terminal, and is configured to transmit a third voltage signal received at the third voltage signal terminal to the pull-down node in response to the third voltage signal, and transmit the second voltage signal to the pull-down node under the control of the potential at the pull-up node;

the cascade pull-down sub-circuit is coupled to the cascade node, the pull-down node, and the second voltage signal terminal, and is configured to transmit the second voltage signal to the cascade node under the control of the potential at the pull-down node;

the output pull-down sub-circuit is coupled to the output signal terminal, the pull-down node, and a fourth voltage signal terminal, and is configured to transmit a fourth voltage signal received at the fourth voltage signal terminal to the output signal terminal under the control of the potential at the pull-down node; and each additional output pull-down sub-circuit, of the at least one additional output pull-down sub-circuit, is coupled to the pull-down node, the fourth voltage signal terminal, and a corresponding additional output signal terminal, and is configured to transmit the fourth voltage signal to the corresponding additional output signal terminal under the control of the potential at the pull-down node.

2. The shift register according to claim 1, wherein
the output sub-circuit includes a first transistor; a control electrode of the first transistor is coupled to the pull-up node, a first electrode of the first transistor is coupled to the first clock signal terminal, and a second electrode of the first transistor is coupled to the output signal terminal.

3. The shift register according to claim 1, wherein
the cascade sub-circuit includes a second transistor and a capacitor; wherein
a control electrode of the second transistor is coupled to the pull-up node, a first electrode of the second transistor is coupled to the second clock signal terminal, and a second electrode of the second transistor is coupled to the cascade node; and
one terminal of the capacitor is coupled to the pull-up node, and another terminal of the capacitor is coupled to the cascade node.

4. The shift register according to claim 1, wherein
each additional output sub-circuit, of the one or more additional output sub-circuits, includes at least one additional transistor; a control electrode of one of the at least one additional transistor is coupled to the cascade node, a first electrode of the additional transistor is coupled to the corresponding clock signal terminal, and a second electrode of the additional transistor is coupled to the corresponding additional output signal terminal.

5. The shift register according to claim 1, wherein
the pull-up control sub-circuit includes a third transistor and a fourth transistor; wherein
a control electrode of the third transistor is coupled to the input signal terminal, a first electrode of the third transistor is coupled to the first voltage signal terminal, and a second electrode of the third transistor is coupled to the pull-up node; and
a control electrode of the fourth transistor is coupled to the pull-down node, a first electrode of the fourth transistor is coupled to the second voltage signal terminal, and a second electrode of the fourth transistor is coupled to the pull-up node;
the pull-down control sub-circuit includes a fifth transistor and a sixth transistor; wherein
a control electrode and a first electrode of the fifth transistor are coupled to the third voltage signal terminal, and a second electrode of the fifth transistor is coupled to the pull-down node and a second electrode of the sixth transistor; and
a control electrode of the sixth transistor is coupled to the pull-up node, and a first electrode of the sixth transistor is coupled to the second voltage signal terminal;
the cascade pull-down sub-circuit includes an eighth transistor; a control electrode of the eighth transistor is coupled to the pull-down node, a first electrode of the eighth transistor is coupled to the second voltage signal terminal, and a second electrode of the eighth transistor is coupled to the cascade node;
the output pull-down sub-circuit includes a ninth transistor; a control electrode of the ninth transistor is coupled to the pull-down node, a first electrode of the ninth transistor is coupled to the fourth voltage signal terminal, and a second electrode of the ninth transistor is coupled to the output signal terminal; and
each additional output pull-down sub-circuit, of the at least one additional output pull-down sub-circuits, includes at least one additional pull-down transistor; a control electrode of one of the at least one additional pull-down transistor is coupled to the pull-down node, a first electrode of the additional pull-down transistor is coupled to the fourth voltage signal terminal, and a second electrode of the additional pull-down transistor is coupled to a corresponding additional output signal terminal.

6. The shift register according to claim 1, further comprising a first reset sub-circuit and a second reset sub-circuit; wherein
the first reset sub-circuit is coupled to a first reset signal terminal, the pull-up node, and the second voltage signal terminal, and is configured to transmit the second voltage signal to the pull-up node in response to a first reset signal received at the first reset signal terminal; and
the second reset sub-circuit is coupled to a second reset signal terminal, the second voltage signal terminal, and the cascade node, and is configured to transmit the second voltage signal to the cascade node in response to a second reset signal received at the second reset signal terminal.

7. The shift register according to claim 6, wherein
the first reset sub-circuit includes a seventh transistor; a control electrode of the seventh transistor is coupled to the first reset signal terminal, a first electrode of the seventh transistor is coupled to the second voltage signal terminal, and a second electrode of the seventh transistor is coupled to the pull-up node; and
the second reset sub-circuit includes a thirteenth transistor; a control electrode of the thirteenth transistor is coupled to the second reset signal terminal, a first electrode of the thirteenth transistor is coupled to the second voltage signal terminal, and a second electrode of the thirteenth transistor is coupled to the cascade node.

8. The shift register according to claim 6, further comprising a third reset sub-circuit, wherein
the third reset sub-circuit is coupled to a third reset signal terminal, the pull-up node, and the second voltage signal terminal, and is configured to transmit the second voltage signal to the pull-up node in response to a third reset signal received at the third reset signal terminal.

9. The shift register according to claim 8, wherein
the third reset sub-circuit includes a tenth transistor; and a control electrode of the tenth transistor is coupled to the third reset signal terminal, a first electrode of the tenth transistor is coupled to the second voltage signal terminal, and a second electrode of the tenth transistor is coupled to the pull-up node.

10. The shift register according to claim 1, wherein
the first additional output sub-circuit is configured to transmit a third clock signal received at the third clock signal terminal to the first additional output signal terminal under the control of the potential at the cascade node.

11. The shift register according to claim 10, wherein
the output sub-circuit includes a first transistor; a control electrode of the first transistor is coupled to the pull-up node, a first electrode of the first transistor is coupled to the first clock signal terminal, and a second electrode of the first transistor is coupled to the output signal terminal;
the cascade sub-circuit includes a second transistor and a capacitor; wherein
a control electrode of the second transistor is coupled to the pull-up node, a first electrode of the second transistor is coupled to the second clock signal terminal, and a second electrode of the second transistor is coupled to the cascade node; and one terminal of the capacitor is coupled to the pull-up node, and another terminal of the capacitor is coupled to the cascade node;

the first additional output sub-circuit includes an eleventh transistor; a control electrode of the eleventh transistor is coupled to the cascade node, a first electrode of the eleventh transistor is coupled to the third clock signal terminal, and a second electrode of the eleventh transistor is coupled to the first additional output signal terminal;

the at least one additional output pull-down sub-circuit comprises a first additional output pull-down sub-circuit; wherein the pull-up control sub-circuit includes a third transistor and a fourth transistor; wherein a control electrode of the third transistor is coupled to an input signal terminal, a first electrode of the third transistor is coupled to a first voltage signal terminal, and a second electrode of the third transistor is coupled to the pull-up node; and a control electrode of the fourth transistor is coupled to a pull-down node, a first electrode of the fourth transistor is coupled to a second voltage signal terminal, and a second electrode of the fourth transistor is coupled to the pull-up node;

the pull-down control sub-circuit includes a fifth transistor and a sixth transistor; wherein a control electrode and a first electrode of the fifth transistor are coupled to a third voltage signal terminal, and a second electrode of the fifth transistor is coupled to the pull-down node and a second electrode of the sixth transistor; and a control electrode of the sixth transistor is coupled to the pull-up node, and a first electrode of the sixth transistor is coupled to the second voltage signal terminal;

the cascade pull-down sub-circuit includes an eighth transistor; a control electrode of the eighth transistor is coupled to the pull-down node, a first electrode of the eighth transistor is coupled to the second voltage signal terminal, and a second electrode of the eighth transistor is coupled to the cascade node;

the output pull-down sub-circuit includes a ninth transistor; a control electrode of the ninth transistor is coupled to the pull-down node, a first electrode of the ninth transistor is coupled to a fourth voltage signal terminal, and a second electrode of the ninth transistor is coupled to the output signal terminal; and the first additional output pull-down sub-circuit includes a twelfth transistor; a control electrode of the twelfth transistor is coupled to the pull-down node, a first electrode of the twelfth transistor is coupled to the fourth voltage signal terminal, and a second electrode of the twelfth transistor is coupled to the first additional output signal terminal.

12. The shift register according to claim 11, further comprising a first reset sub-circuit, a second reset sub-circuit and a third reset sub-circuit; wherein the first reset sub-circuit includes a seventh transistor; a control electrode of the seventh transistor is coupled to a first reset signal terminal, a first electrode of the seventh transistor is coupled to the second voltage signal terminal, and a second electrode of the seventh transistor is coupled to the pull-up node;

the second reset sub-circuit includes a thirteenth transistor; a control electrode of the thirteenth transistor is coupled to a second reset signal terminal, a first electrode of the thirteenth transistor is coupled to the second voltage signal terminal, and a second electrode of the thirteenth transistor is coupled to the cascade node; and the third reset sub-circuit includes a tenth transistor; a control electrode of the tenth transistor is coupled to a third reset signal terminal, a first electrode of the tenth transistor is coupled to the second voltage signal terminal, and a second electrode of the tenth transistor is coupled to the pull-up node.

13. The shift register according to claim 11, wherein the second additional output sub-circuit includes a fourteenth transistor; a control electrode of the fourteenth transistor is coupled to the cascade node, a first electrode of the fourteenth transistor is coupled to a fourth clock signal terminal, and a second electrode of the fourteenth transistor is coupled to a second additional output signal terminal; and the at least one additional output pull-down sub-circuit further comprises a second additional output pull-down sub-circuit; the second additional output pull-down sub-circuit includes a fifteenth transistor; a control electrode of the fifteenth transistor is coupled to the pull-down node, a first electrode of the fifteenth transistor is coupled to the fourth voltage signal terminal, and a second electrode of the fifteenth transistor is coupled to the second additional output signal terminal.

14. The gate driver circuit according to claim 1, wherein each shift register has an input signal terminal, a first reset signal terminal, and a cascade signal output terminal coupled to the cascade node;

input signal terminals of first two stage shift registers are both coupled to a frame start signal terminal;

except the first two stage shift registers, an input signal terminal of an Nth-stage shift register is coupled to a cascade signal output terminal of a (N−2)th-stage shift register; and except last three stage shift registers, a first reset signal terminal of the Nth-stage shift register is coupled to a cascade signal output terminal of a (N+3)th-stage shift register.

15. A display device, comprising: the gate driver comprising a plurality of shift registers that are cascaded, each of the plurality of shift registers being the shift register; and a plurality of gate lines, the plurality of gate lines being divided into a plurality of gate line groups, and each gate line group including at least two gate lines arranged in sequence; wherein the plurality of shift registers included in the gate driver circuit each correspond to a respective one of the plurality of gate line groups, and the output signal terminal and at least one additional output signal terminal in each shift register are coupled to at least two gate lines in a corresponding gate line group, wherein each of the plurality of shift registers, comprises an output sub-circuit, a cascade sub-circuit, and at least one or more additional output sub-circuit sub-circuits, a pull-up control sub-circuit, a pull-down control sub-circuit, a cascade pull-down sub-circuit, an output pull-down sub-circuit and at least one additional output pull-down sub-circuit, wherein the output sub-circuit is coupled to a first clock signal terminal, a pull-up node, and an output signal terminal, and is configured to transmit a first clock signal received at the first clock signal terminal to the output signal terminal under control of a potential at the pull-up node, so as to scan a gate line coupled to the output signal terminal;

the cascade sub-circuit is coupled to a second clock signal terminal, the pull-up node, and a cascade node, and is configured to transmit a second clock signal received at the second clock signal terminal to the cascade node under the control of the potential at the pull-up node; in a case where the shift resister comprises a first additional output sub-circuit, the first additional output sub-circuit is coupled to a third clock signal terminal, the cascade node, and a first additional output signal terminal: in a case where the shift resister further comprises a second additional output sub-circuit, the second additional output sub-circuit is coupled to a corresponding fourth clock signal terminal, the cascade node, and a corresponding second additional output signal terminal; each additional output sub-circuit, of the one or more additional output sub-circuits, is configured to transmit a clock signal received at a corresponding clock signal terminal of the third clock signal terminal or the fourth clock signal terminal to the corresponding additional output signal terminal of the first additional output signal terminal or the second additional output signal terminal under control of a potential at the cascade node, so as to scan a gate line coupled to the corresponding additional output signal terminal; the pull-up control sub-circuit is coupled to an input signal terminal, a first voltage signal terminal, the pull-up node, a pull-down node, and a second voltage signal terminal, and is configured to transmit a first voltage signal received at the first voltage signal terminal to the pull-up node in response to an input signal received at the input signal terminal, and transmit a second voltage signal received at the second voltage signal terminal to the pull-up node under control of a potential at the pull-down node; the pull-down control sub-circuit is coupled to a third voltage signal terminal, the pull-down node, the pull-up node, and the second voltage signal terminal, and is configured to transmit a third voltage signal received at the third voltage signal terminal to the pull-down node in response to the third voltage signal, and transmit the second voltage signal to the pull-down node under the control of the potential at the pull-up node; the cascade pull-down sub-circuit is coupled to the cascade node, the pull-down node, and the second voltage signal terminal, and is configured to transmit the second voltage signal to the cascade node under the control of the potential at the pull-down node; the output pull-down sub-circuit is coupled to the output signal terminal, the pull-down node, and a fourth voltage signal terminal, and is configured to transmit a fourth voltage signal received at the fourth voltage signal terminal to the output signal terminal under the control of the potential at the pull-down node; and each additional output pull-down sub-circuit, of the at least one additional output pull-down sub-circuit, is coupled to the pull-down node, the fourth voltage signal terminal, and a corresponding additional output signal terminal, and is configured to transmit the fourth voltage signal to the corresponding additional output signal terminal under the control of the potential at the pull-down node.

16. A driving method for a shift register, configured to drive the shift register, wherein the shift register comprises:

an output sub-circuit, a cascade sub-circuit, one or more additional output sub-circuits, a pull-up control sub-circuit, a pull-down control sub-circuit, a cascade pull-down sub-circuit, an output pull-down sub-circuit and at least one additional output pull-down sub-circuit, wherein the output sub-circuit is coupled to a first clock signal terminal, a pull-up node, and an output signal terminal, and is configured to transmit a first clock signal received at the first clock signal terminal to the output signal terminal under control of a potential at the pull-up node, so as to scan a gate line coupled to the output signal terminal;

the cascade sub-circuit is coupled to a second clock signal terminal, the pull-up node, and a cascade node, and is configured to transmit a second clock signal received at the second clock signal terminal to the cascade node under the control of the potential at the pull-up node;

in a case where the shift register comprises a first additional output sub-circuit, the first additional output sub-circuit is coupled to a third clock signal terminal, the cascade node, and a first additional output signal terminal;

in a case where the shift register further comprises a second additional output sub-circuit, the second additional output sub-circuit is coupled to a fourth clock signal terminal, the cascade node, and a second additional output signal terminal;

each additional output sub-circuit, of the one or more additional output sub-circuits, is configured to transmit a clock signal received at a corresponding clock signal terminal of the third clock signal terminal or the fourth clock signal terminal to the corresponding additional output signal terminal of the first additional output signal terminal or the second additional output signal terminal under control of a potential at the cascade node, so as to scan a gate line coupled to the corresponding additional output signal terminal;

the pull-up control sub-circuit is coupled to an input signal terminal, a first voltage signal terminal, the pull-up node, a pull-down node, and a second voltage signal terminal, and is configured to transmit a first voltage signal received at the first voltage signal terminal to the pull-up node in response to an input signal received at the input signal terminal, and transmit a second voltage signal received at the second voltage signal terminal to the pull-up node under control of a potential at the pull-down node;

the pull-down control sub-circuit is coupled to a third voltage signal terminal, the pull-down node, the pull-up node, and the second voltage signal terminal, and is configured to transmit a third voltage signal received at the third voltage signal terminal to the pull-down node in response to the third voltage signal, and transmit the second voltage signal to the pull-down node under the control of the potential at the pull-up node;

the cascade pull-down sub-circuit is coupled to the cascade node, the pull-down node, and the second voltage signal terminal, and is configured to transmit the second voltage signal to the cascade node under the control of the potential at the pull-down node;

the output pull-down sub-circuit is coupled to the output signal terminal, the pull-down node, and a fourth voltage signal terminal, and is configured to transmit a fourth voltage signal received at the fourth voltage signal terminal to the output signal terminal under the control of the potential at the pull-down node; and each additional output pull-down sub-circuit, of the at least one additional output pull-down sub-circuit, is coupled to the pull-down node, the fourth voltage signal terminal, and a corresponding additional output signal terminal, and is configured to transmit the fourth voltage signal to the corresponding additional output signal terminal under the control of the potential at the pull-down node;

the method comprises:

in a first period,
- receiving, by the pull-up control sub-circuit, an input signal,
- transmitting, by the pull-up control sub-circuit, a first voltage signal to the pull-up node, and
- storing, by a cascade sub-circuit, a voltage at the pull-up node; and in a second period,
- discharging, by the cascade sub-circuit, the pull-up node; wherein an output sub-circuit is turned on under control of a potential at the pull-up node, to transmit a first clock signal to the output signal terminal, so as to scan a gate line coupled to the output signal terminal; and the cascade sub-circuit is turned on under control of a potential at the pull-up node to transmit a second clock signal to the cascade node; and each additional output sub-circuit, of the one or more additional output sub-circuits, is turned on under control of a potential at the cascade node to transmit a clock signal received at the corresponding clock signal terminal of the third clock signal terminal or the fourth clock signal terminal to a corresponding additional output signal terminal of the first additional output signal terminal or the second additional output signal terminal, so as to scan a gate line coupled to the corresponding additional output signal terminal.

17. The driving method according to claim 16, wherein in a case where the shift register further includes a first reset sub-circuit, the driving method further comprises:

in a third period,
- receiving, by the first reset sub-circuit, a first reset signal, and
- transmitting, by the first reset sub-circuit, a second voltage signal to the pull-up node, wherein the output sub-circuit and the cascade sub-circuit are turned off under the control of the potential at the pull-up node;

each additional output sub-circuit, of the one or more additional output sub-circuits, is turned off under the control of the potential at the cascade node; and the output pull-down sub-circuit is turned on under control of a potential at the pull-down node to transmit a fourth voltage signal to the output signal terminal, so as to reduce noise of a signal at the output signal terminal; the cascade pull-down sub-circuit is turned on under control of the potential at the pull-down node to transmit the second voltage signal to the cascade node correspondingly, so as to reduce noise of a signal at the cascade node; and each additional output pull-down sub-circuit, of the at least one additional output pull-down sub-circuits, is turned on under control of the potential at the pull-down node to transmit the fourth voltage signal to a corresponding additional output signal terminal, so as to reduce noise of a signal at the corresponding additional output signal terminal.

* * * * *